(12) United States Patent
Hirose

(10) Patent No.: US 8,488,358 B2
(45) Date of Patent: Jul. 16, 2013

(54) SEMICONDUCTOR STORAGE DEVICE

(75) Inventor: Masanobu Hirose, Kyoto (JP)

(73) Assignee: Panasonic Corporation, Osaka (JP)

( * ) Notice: Subject to any disclaimer, the term of this patent is extended or adjusted under 35 U.S.C. 154(b) by 965 days.

(21) Appl. No.: 12/294,351

(22) PCT Filed: Mar. 30, 2007

(86) PCT No.: PCT/JP2007/057079
§ 371 (c)(1),
(2), (4) Date: Sep. 24, 2008

(87) PCT Pub. No.: WO2007/114328
PCT Pub. Date: Oct. 11, 2007

(65) Prior Publication Data
US 2009/0135639 A1    May 28, 2009

(30) Foreign Application Priority Data
Mar. 31, 2006  (JP) .................. 2006-099409

(51) Int. Cl.
| G11C 5/06 | (2006.01) |
| G11C 5/02 | (2006.01) |
| G11C 11/401 | (2006.01) |
| G11C 11/24 | (2006.01) |
| G11C 5/10 | (2006.01) |
| G11C 7/18 | (2006.01) |
| G11C 7/14 | (2006.01) |
| G11C 11/4097 | (2006.01) |
| G11C 11/4099 | (2006.01) |

(52) U.S. Cl.
USPC ............ 365/72; 365/51; 365/63; 365/230.03; 365/210.1; 365/149

(58) Field of Classification Search
USPC ................ 365/210.1, 230.03, 51, 63, 72, 149
See application file for complete search history.

(56) References Cited

U.S. PATENT DOCUMENTS
4,970,685 A   11/1990  Koyanagi
5,495,440 A * 2/1996  Asakura ........................ 365/149
(Continued)

FOREIGN PATENT DOCUMENTS
CN    1141508 A    1/1997
CN    1220464 A    6/1999
(Continued)

OTHER PUBLICATIONS
Chinese Office Action issued in Chinese Patent Application No. CN 200780011729.7 dated Mar. 11, 2010.

*Primary Examiner* — J. H. Hur
(74) *Attorney, Agent, or Firm* — McDermott Will & Emery LLP

(57) ABSTRACT

In a semiconductor storage device, either two memory cell gates TG or a memory cell gate TG and a bit-line connecting gate SW are formed in every set of n-type doped regions OD at the intersections with word lines WL or bit-line selecting lines KS. A portion near the center of the set of n-type doped regions OD serves as a source/drain region shared by two gates, whereas portions near both ends thereof serve as source/drain regions for respective gates. Each of the source/drain regions is connected to a storage electrode SN of a memory cell capacitor via a storage contact CA or is connected to a sub bit line or a main bit line via a sub-bit-line contact CH and/or a via of a metal interconnection. A pattern formed of four memory cell gates TG and four bit-line connecting gates SW is repeated.

39 Claims, 18 Drawing Sheets

| U.S. PATENT DOCUMENTS | | | | FOREIGN PATENT DOCUMENTS | | |
|---|---|---|---|---|---|---|
| 5,701,269 A | 12/1997 | Fujii | | CN | 1581490 A | 2/2005 |
| 5,715,189 A | 2/1998 | Asakura | | JP | 02-263387 | 10/1990 |
| 5,815,428 A | 9/1998 | Tsuruda et al. | | JP | 6-349267 | 12/1994 |
| 5,828,594 A | 10/1998 | Fujii | | JP | 8-236714 | 9/1996 |
| 5,917,744 A | 6/1999 | Kirihata et al. | | JP | 9-045879 | 2/1997 |
| 5,963,467 A | 10/1999 | Miyatake et al. | | JP | 9-246482 | 9/1997 |
| 6,178,108 B1 | 1/2001 | Miyatake et al. | | JP | 10-163451 | 6/1998 |
| 6,815,281 B1 | 11/2004 | Inoue et al. | | JP | 2001-127270 | 5/2001 |
| 2002/0175349 A1 | 11/2002 | Morikawa | | JP | 2003-100080 | 4/2003 |
| 2003/0123272 A1 | 7/2003 | Kang et al. | | JP | 2003-282841 | 10/2003 |
| 2005/0009258 A1 | 1/2005 | Inoue et al. | | JP | 2005-333165 | 12/2005 |
| 2005/0041499 A1 | 2/2005 | Shibayama | | | | |
| 2005/0116273 A1 | 6/2005 | Inoue et al. | | | | |

* cited by examiner

SECTION C-C

FIG. 5 SECTION D-D

FIG. 6  SECTION E-E

SECTION F-F

SEMICONDUCTOR STORAGE DEVICE

RELATED APPLICATIONS

This application is the U.S. National Phase under 35 U.S.C. §371 of International Application No. PCT/JP2007/057079, filed on Mar. 30, 2007, which in turn claims the benefit of Japanese Application No. 2006-099409, filed on Mar. 31, 2006, the disclosures of which Applications are incorporated by reference herein.

TECHNICAL FIELD

The present invention relates to semiconductor storage devices, particularly to a dynamic random Access memory (DRAM) with a so-called hierarchical bit-line architecture in which a plurality of sub bit lines are provided for a main bit line, and also relates to, for example, so-called system LSI including such semiconductor storage devices.

BACKGROUND ART

In a DRAM, when large parasitic capacitance exists on bit lines, charge accumulated in a memory cell causes a small potential difference between a pair of bit lines so that accurate read-out is difficult. To suppress the parasitic capacitance of the bit lines, a smaller number of memory cells need to be connected to the bit lines. However, since a sense amplifier for amplifying the potential difference between a pair of bit lines is provided for each bit line pair, reduction in number of memory cells connected to the bit lines causes the area occupied by the sense amplifiers to increase relative to the area occupied by the memory cells on a semiconductor chip. As a result, it becomes difficult to increase the storage capacity.

In view of this, proposed was a technique for suppressing actual parasitic capacitance by providing a plurality of sub bit lines connected to a given number of memory cells and selectively connecting one of the sub bit lines to each main bit line (see, for example, Patent Document 1).

Specifically, as illustrated in FIG. 1 of the document, 16 pairs of sub bit lines BLs1 and /BLs1 are provided for, for example, a pair of main bit lines BLm1 and /BLm1. The sub bit lines BLs1 and /BLs1 are selectively connected to the respective main bit lines BLm1 and /BLm1 via bit-line connecting transistors T1 and /T1 controlled by selection lines BS1 through BS16.

The bit-line connecting transistors T1 and /T1, for example, are arranged on a semiconductor chip in the following manner. That is, although not clearly shown in FIG. 2 of the document, the bit-line connecting transistors /T1 for selectively connecting the sub bit lines /BLs1 to the main bit line /BLm1, for example, are located at the intersections of the selection lines BS2 and BS3 and the main bit line /BLm1. The bit-line connecting transistors T1 for selectively connecting the sub bit lines BLs1 to the main bit line BLm1, for example, are located at the intersections of the selection lines either BS1 and BS2 or BS3 and BS4 and the main bit line /BLm1 in the other ends of sub blocks Bs2 and Bs3 which are not shown.

An access transistor for connecting a memory cell capacitor of each memory cell to, for example, the sub bit line BLs1 is located at the intersection of the main bit line BLm1 and each of word lines WL2, WL3, WL6, WL7, . . . . An access transistor connected to the sub bit line /BLs1 is located at the intersection of the main bit line /BLm1 and each of word lines WL1, WL4, WL5, WL8, WL9, . . . . That is, unit patterns at adjacent two of the four interconnections of four adjacent word lines and the main bit line appear repeatedly along the main bit line. For main bit lines which are adjacent along the word lines, the unit patterns shift by two intersections.

Patent Document 1: Japanese Unexamined Patent Publication No. 6-349267

DISCLOSURE OF INVENTION

Problems that the Invention is to Solve

However, in a semiconductor storage device as described above, the access transistors and the bit-line connecting transistors T1 . . . are not regularly arranged, so that it is difficult to accurately form the transistors and lines in high density. Specifically, process variations during fabrication increase (which become notable especially for size reduction in fabrication processes) so that electrical characteristics of the memory cells and the bit-line connecting transistors cannot be made uniform. Accordingly, reduction in layout area and increase in storage capacity are not readily achieved and it is difficult to enhance (maintain) the yield.

Specifically, with respect to the main bit line BLm1, for example, access transistors are provided at the intersections with word lines WL62 and WL63 in the sub block Bs2 and the word lines WL2 and WL3 in the sub block Bs3, for example, whereas no access transistors are provided at four intersections with an intermediate word line WL64, the selection lines BS2 and BS3 and the word line WL1. On the other hand, with respect to the main bit line /BLm1, access transistors or the bit-line connecting transistors /T1 are sequentially provided at four intersections with the word line WL64 and the selection lines BS2 and BS3 in the sub block Bs2 and the word lines WL1 and WL4 in the sub block Bs3.

It is therefore an object of the present invention to ease reduction in layout area on a semiconductor chip and enhancement of the fabrication yield, for example.

Means of Solving the Problems

According to the present invention, a semiconductor storage device includes: a plurality of sub memory arrays each including a plurality of memory cells and sub bit lines, the memory cells including cell transistors; a main bit line; and bit-line connecting transistors for selectively connecting the sub bit lines to the main bit line. The sub memory arrays are arranged such that the sub bit lines are aligned along the main bit line, and a pattern formed of given numbers of the cell transistors and the bit-line connecting transistors is repeated.

With this structure, uniformity in layout pattern on a semiconductor chip is enhanced.

Effects of the Invention

According to the present invention, uniformity in layout pattern on a semiconductor chip is enhanced to suppress process variations during fabrication, thus easily enabling reduction in layout area and enhancement (maintenance) of the fabrication yield.

DESCRIPTION OF NUMERALS

Figure 1:
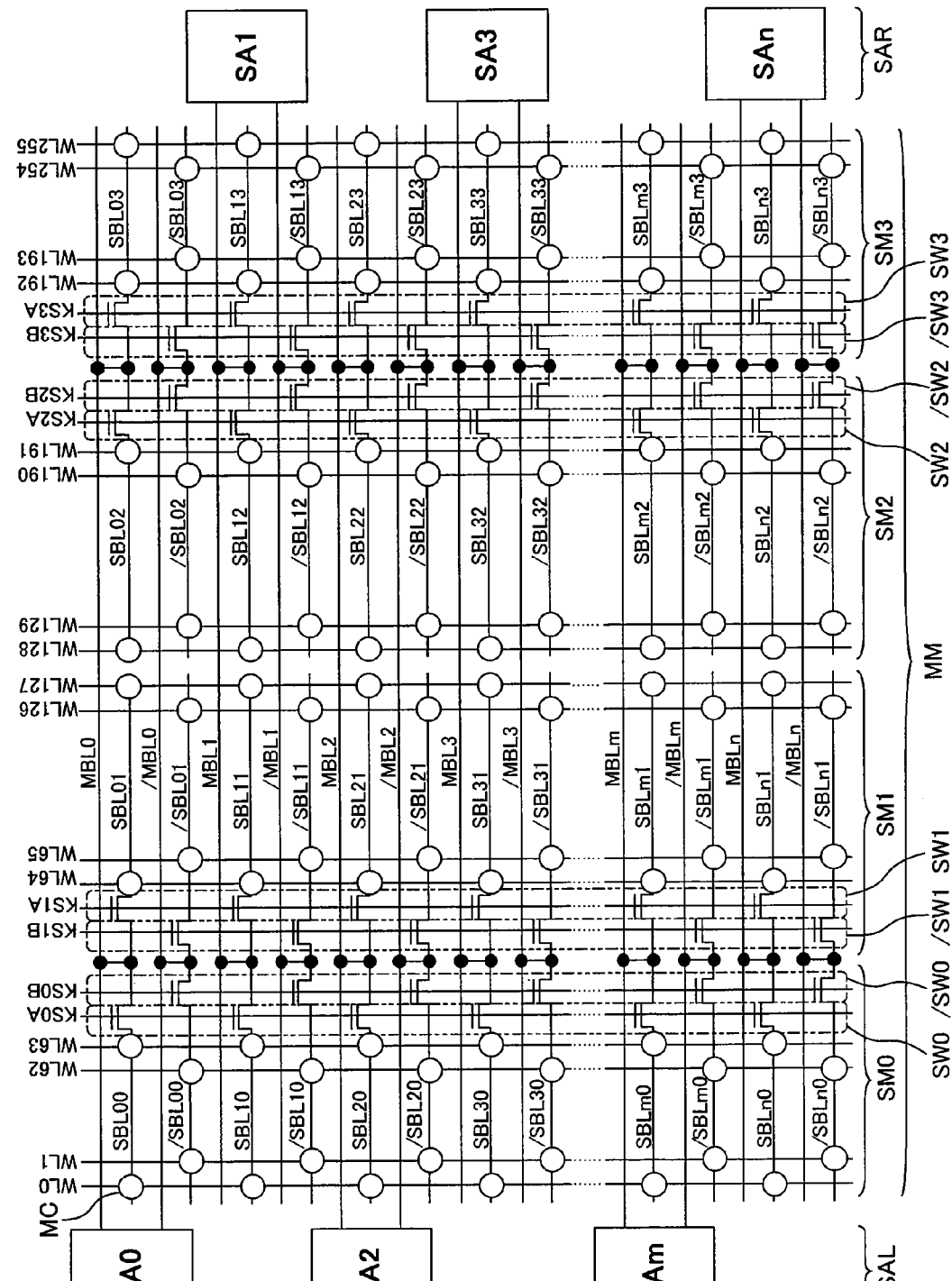
FIG. 1 is a circuit diagram illustrating a configuration of a DRAM according to a first embodiment of the present invention.

MC memory cell
MM main memory array
SM sub memory array
MBL main bit line pair
SBL sub bit line
WL word line
KS bit-line selecting line
SW bit-line connecting gate
SA sense amplifier
TG memory cell gate
OD n-type doped region
CA storage contact
CH sub-bit-line contact
SN storage electrode
PL plate electrode
Cs memory cell capacitor
Cox oxide film
WD word-line driving circuit
KD sub-memory-array-selecting-line driving circuit
ST word-line backing region
DBL dummy bit line
DWL dummy word line
SWL auxiliary word line
DUM dummy memory cell region
RW redundant memory cell region
V1 via
MCL, MCR memory cell array
SA sense amplifier
WL word line
WD word-line driving circuit
RD row decoder
BLL, /BLL, BLR, /BLR bit line
Q1, Q2, Q3, Q4 shared switch transistor
Q5, Q6, Q7, Q8 precharge transistor
RPL, PRR precharge control signal
PD precharge-control-signal driving circuit
SSL, SSR shared-switch control signal
SD shared-switch-control-signal driving circuit
SEN, SEP sense-amplifier control signal
SC sense-amplifier control circuit block
VBP bit-line precharge power supply
G1, G2, G3, G4 gate electrode
N1, N2, N3, N4 source/drain electrode
OX1, OX2, OX3, OX4 gate insulating film
HV1 photomask for forming gate insulating films
VT1, VT2, VT3 photomask for determining threshold voltages
LD1, LD2 photomask for forming source/drain electrodes

BEST MODE FOR CARRYING OUT THE INVENTION

Hereinafter, embodiments of the present invention will be described with reference to the drawings. In the following embodiments, each member with substantially the same function is identified by the same reference numeral and description thereof is not repeated.

Embodiment 1

(DRAM circuit)

First, a DRAM circuit according to a first embodiment will be described with reference to FIG. 1.

This DRAM includes four sub memory arrays SM0 through SM3 in a main memory array MM and is configured to store data of 4×n bits×64 words. Bit lines for inputting/outputting stored data have a hierarchical bit-line architecture including main bit lines MBL0 through MBLn (and /MBL0 through /MBLn) and sub bit lines SBL00 through SBLn0, . . . SBL03 through SBLn3 (and /SBL00 through /SBLn0, . . . /SBL03 through /SBLn3). Each of the main bit lines is shared by the four sub memory arrays SM0 through SM3. The sub bit lines SBL00 through SBLn0, . . . SBL03 through SBLn3 (and /SBL00 through /SBLn0, . . . /SBL03 through /SBLn3) are respectively associated with the sub memory arrays SM0 through SM3. The bit lines also have a folded bit-line architecture.

Hereinafter, a portion of the sub memory array SM0 in which data of the first and second bits is stored will be mainly described as an example. Memory cells MC in each of which data of one bit is stored are provided at the intersections of two of every four of word lines WL0 through WL63 and the sub bit lines SBL00 and /SBL00, respectively. More specifically, the memory cells MC are provided at the intersections of the word lines WL0, WL3, WL4, WL7, WL8, . . . , WL59, WL60, and WL63 and the sub bit lines SBL00 and the intersections of the word lines WL1, WL2, WL5, WL6, . . . , WL61, and WL62 and the sub bit line /SBL00.

The sub bit lines SBL00 and /SBL00 are connected to the main bit lines MBL0 and /MBL0 via bit-line connecting gates SW00 and /SW00 (bit-line connecting gate series SW0 and /SW0) controlled by bit-line selecting lines KS0A and KS0B, respectively. Specifically, the sub memory arrays SM0 through SM3 are selected by selectively connecting the sub bit lines SBL00, /SBL00, . . . to the main bit lines MBL0 and /MBL0.

The main bit lines MBL0 and /MBL0 are connected to a sense amplifier SA0 so that a potential difference occurring between these main bit lines according to data stored in the memory cells MC is amplified.

In addition to the circuit configuration of the DRAM, FIG. 1 also generally illustrates a relationship in arrangement of components which will be described later. Specifically, the bit-line connecting gate series SW0, /SW0, SW1, and /SW1 are arranged in line symmetry near the midpoint between the sub memory arrays SM0 and SM1, and the bit-line connecting gate series SW2, /SW2, SW3, and /SW3 are arranged in line symmetry near the midpoint between the sub memory arrays SM2 and SM3. The order of arrangement of the bit-line connecting gate series SW0 . . . may differ as long as the line symmetry is maintained.

(Layout of DRAM on Semiconductor Chip)

Next, the layout of the circuit components on a semiconductor chip will be described with reference to FIGS. 2 through 7.

Figure 2:
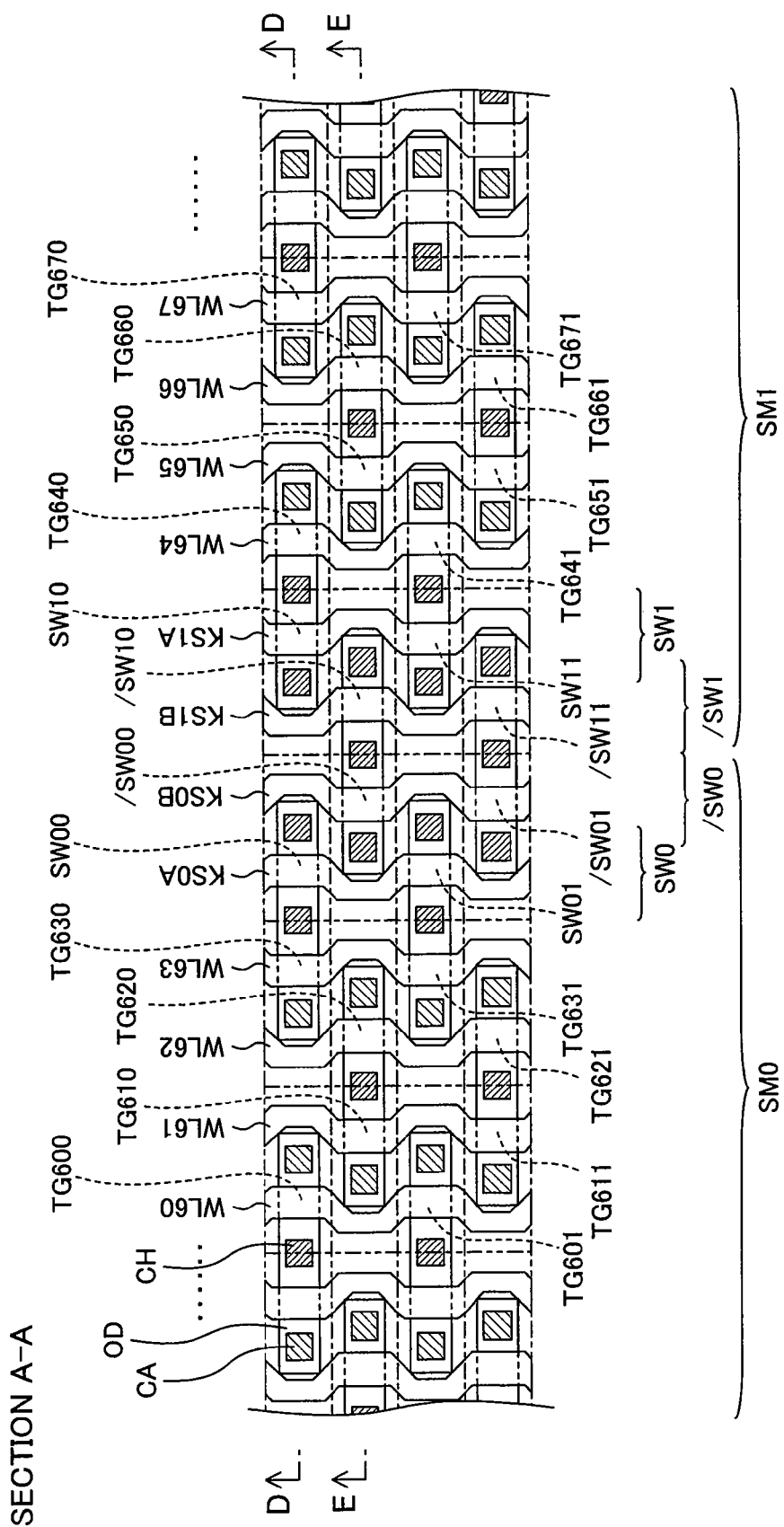
FIG. 2 is a cross-sectional view taken along the line A-A in FIGS. 5 and 6 for the DRAM of the first embodiment.
Figure 5:
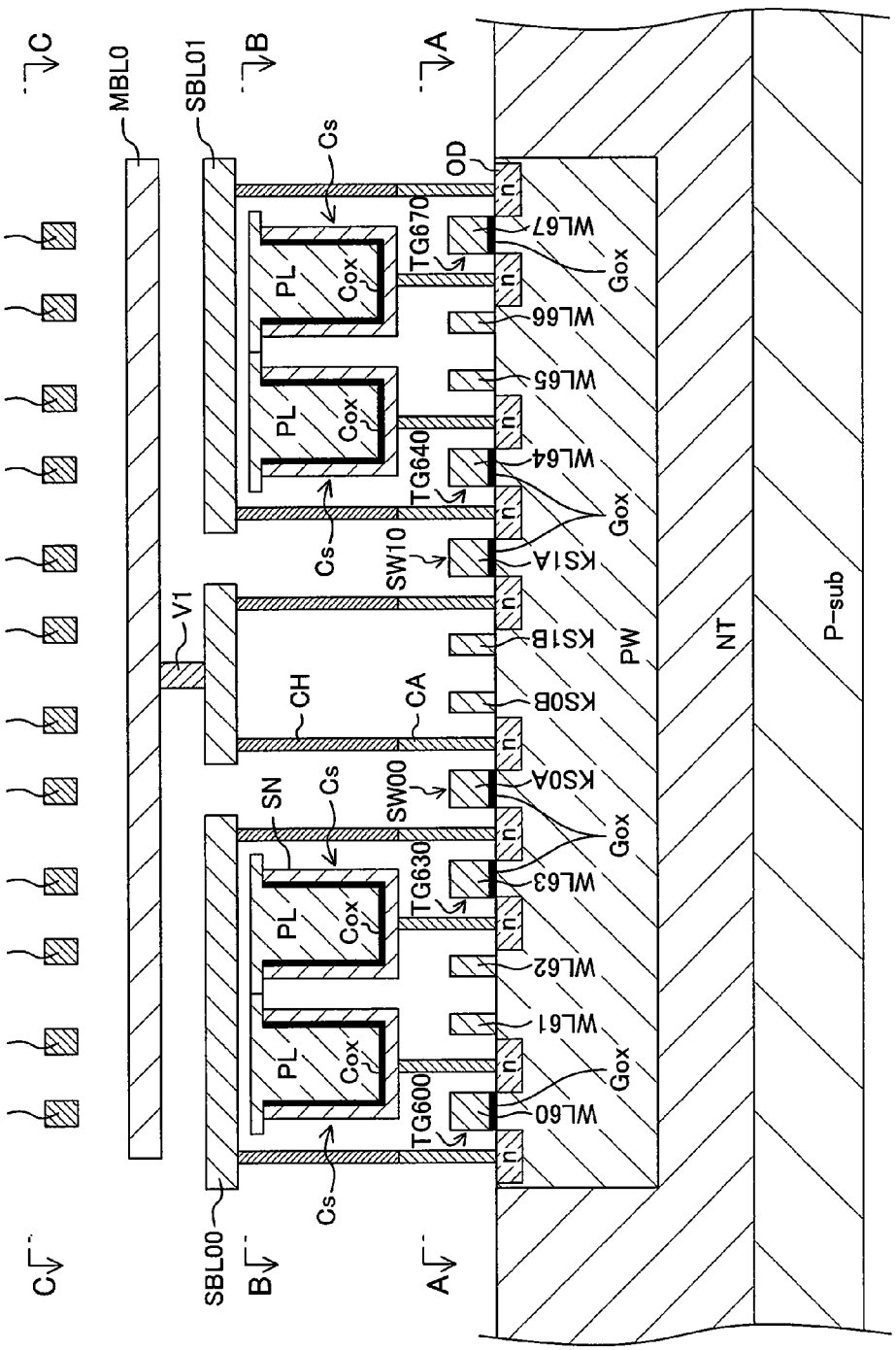
FIG. 5 is a cross-sectional view taken along the line D-D in FIGS. 2 through 4 for the DRAM of the first embodiment.
Figure 6:
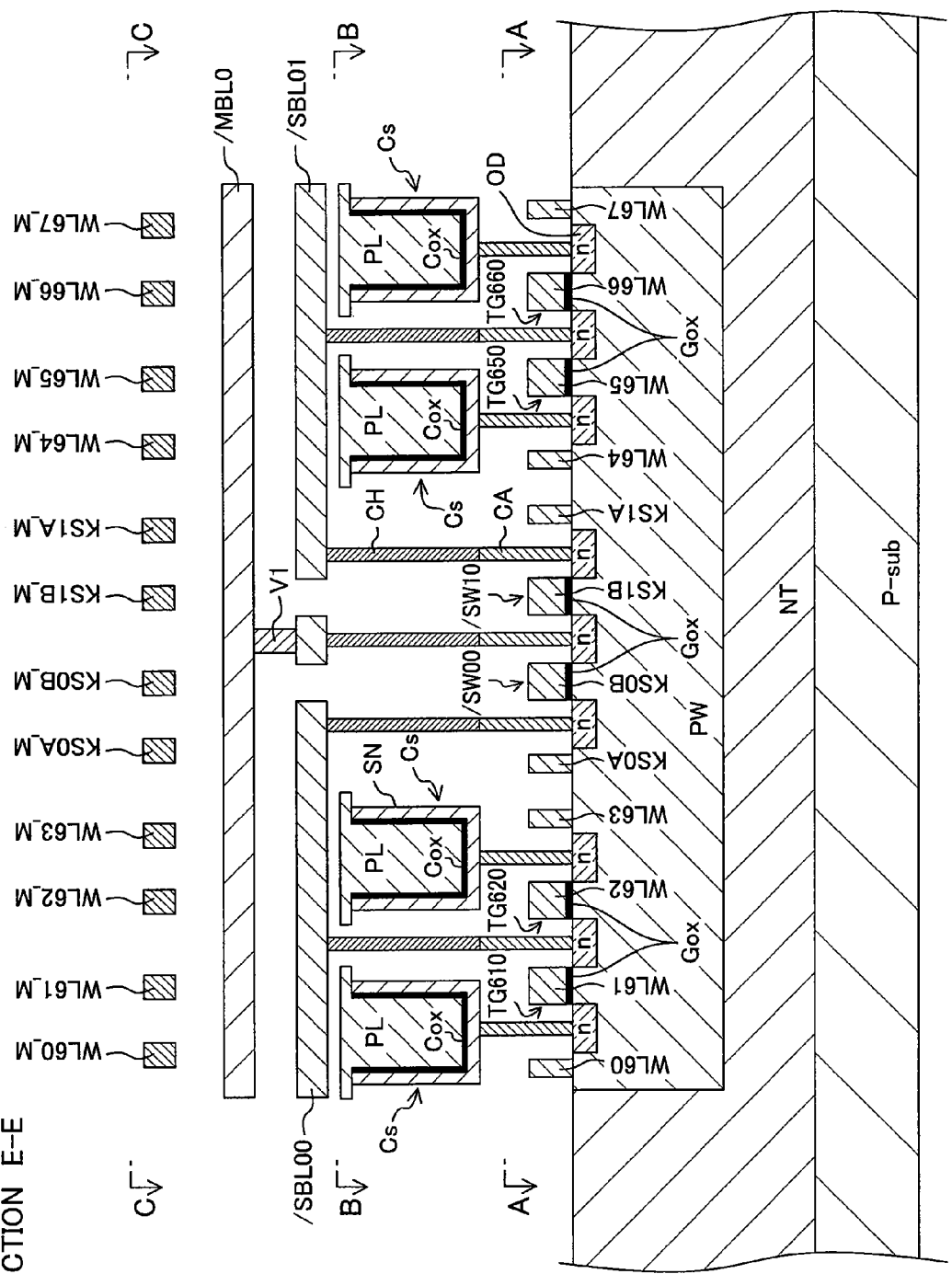
FIG. 6 is a cross-sectional view taken along the line E-E in FIGS. 2 through 4 for the DRAM of the first embodiment.

FIG. 2 is a cross-sectional view taken along the line A-A in FIGS. 5 and 6 and illustrates an arrangement, for example, of transistors formed on a semiconductor substrate.

Figure 3:
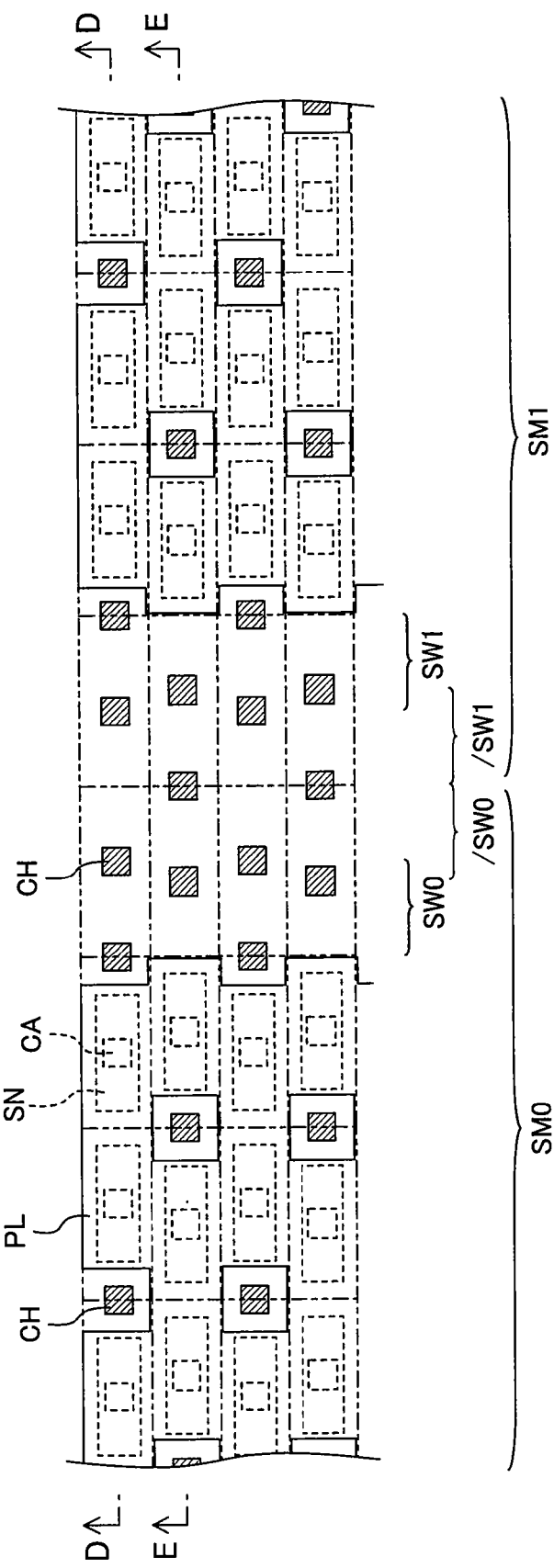
FIG. 3 is a cross-sectional view taken along the line B-B in FIGS. 5 and 6 for the DRAM of the first embodiment.

FIG. 3 is a cross-sectional view taken along the line B-B in FIGS. 5 and 6 and illustrates an arrangement, for example, of plate electrodes PL forming memory capacitors Cs and storage electrodes SN under the sub bit lines SBL00 . . . .

Figure 4:
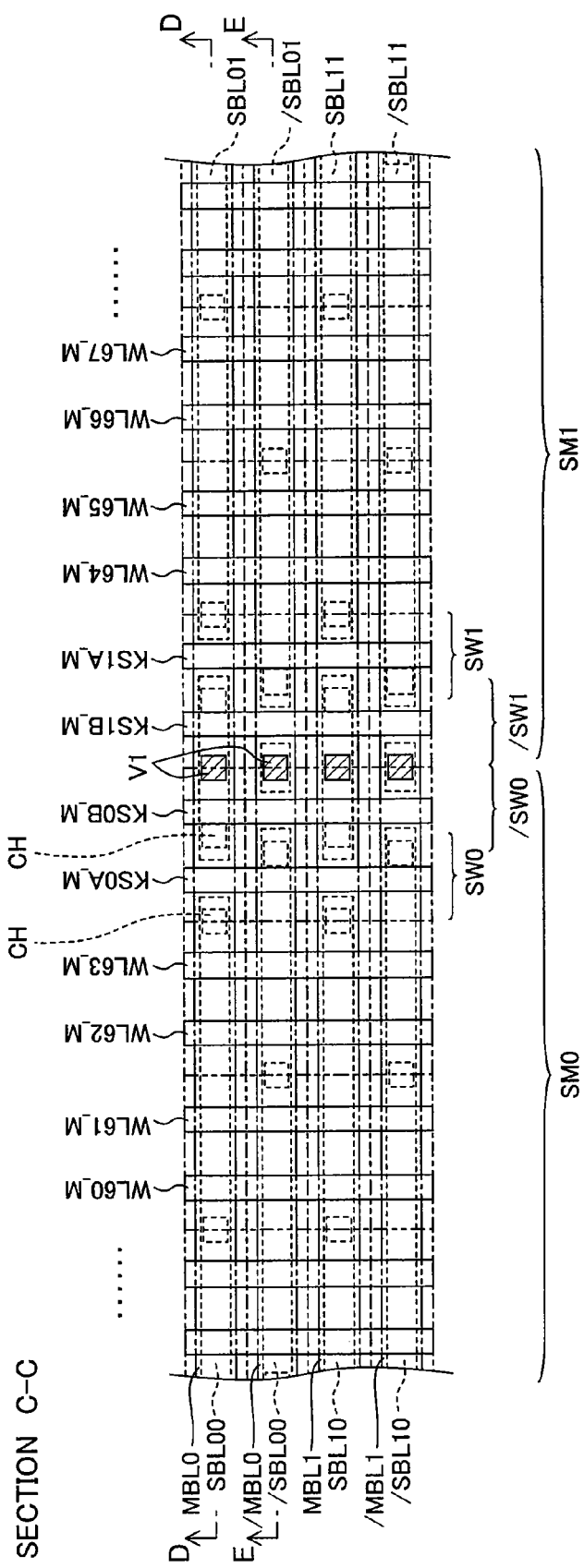
FIG. 4 is a cross-sectional view taken along the line C-C in FIGS. 5 and 6 for the DRAM of the first embodiment.

FIG. 4 is a cross-sectional view taken along the line C-C in FIGS. 5 and 6 and illustrates an arrangement, for example, of the sub bit lines SBL00 . . . , the main bit lines MBL0 . . . , word-line backing lines WL60_M . . . , and bit-line-selecting-line backing lines.

FIG. 5 is a cross-sectional view taken along the line D-D in FIGS. 2 through 4, i.e., shows a vertical cross section at the main bit line MBL0.

FIG. 6 is a cross-sectional view taken along the line E-E in FIGS. 2 through 4, i.e., shows a vertical cross section at the main bit line /MBL0.

Figure 7:
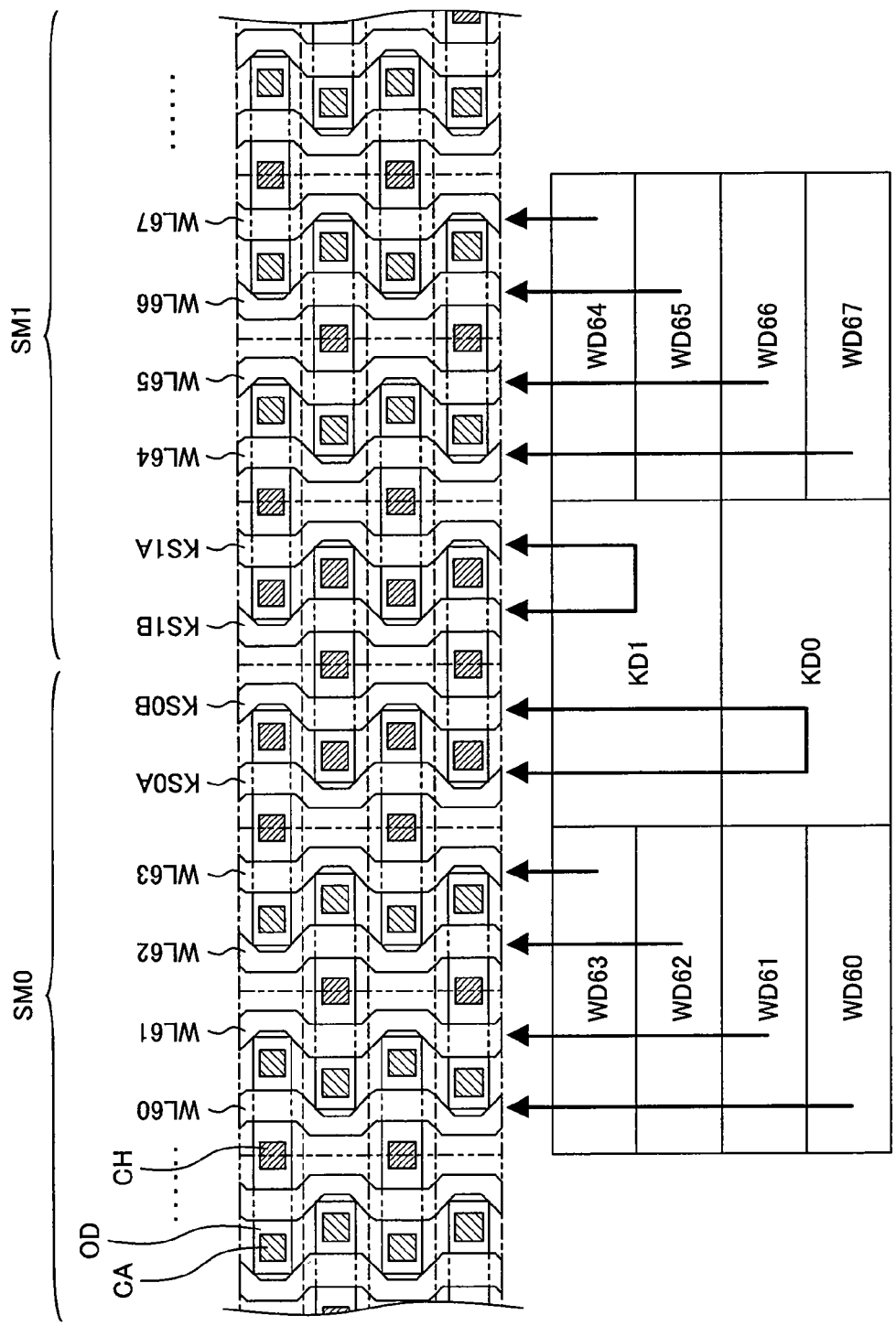
FIG. 7 is a view schematically showing an arrangement of word-line driving circuits and sub-memory-array-selecting-line driving circuits in the DRAM of the first embodiment.

FIG. 7 is a view schematically showing an arrangement of word-line driving circuits WD60 through WD67 and bit-line-selecting-line driving circuits KD0 and KD1 in association with FIG. 2.

In the following description, numeric characters and "/" included in the reference numerals will be omitted when a distinction among equivalent components is unnecessary.

As illustrated in FIG. 2, n-type doped regions OD are defined in a semiconductor substrate. A memory cell gate TG or a bit-line connecting gate SW is provided at the intersection of each of the n-type doped regions OD and either a word line WL or a bit-line selecting line KS.

More specifically, either two memory cell gates TG or a memory cell gate TG and a bit-line connecting gate SW (nMOSFETs) are formed for every set of n-type doped regions OD. A portion near the center of the set of n-type doped regions OD serves as a source/drain region shared by two gates, whereas portions near both ends thereof serve as source/drain regions for respective gates. As illustrated in FIGS. 5 and 6, each of the source/drain regions is connected to a storage electrode SN of a memory cell capacitor Cs via a storage contact CA, is connected to the sub bit line SBL via a storage contact CA and a sub-bit-line contact CH, or is connected to the main bit line MBL via a storage contact CA, a sub-bit-line contact CH, and a via V1 of a metal interconnection. (Here, to be more precise, only storage contacts CA should appear in the cross-section of FIG. 2 but portions corresponding to sub-bit-line contacts CH at a higher layer is also shown by a different hatched pattern with reference numeral CH added thereto for convenience of understanding.)

The n-type doped regions OD are staggered such that the n-type doped regions OD are repeatedly arranged at the same pitch, irrelevantly to whether the memory cell gates TG or the bit-line connecting gates SW are formed. The word lines WL and the bit-line selecting lines KS are also arranged at the same pitch. Accordingly, the memory cell gates TG and the bit-line connecting gates SW are also arranged in high symmetry to form a repetitive pattern (a staggered pattern) in the sub memory arrays SM0 through SM3 including the boundaries thereof.

As illustrated in FIGS. 5 and 6, the memory cell capacitors Cs are provided above the n-type doped regions OD and the word lines WL, for example, and have a three-dimensional structure in which an oxide film Cox is interposed between the plate electrodes PL and the storage electrodes SN. As shown in FIG. 3, upper portions of the plate electrodes PL are continuous in each of the sub memory arrays SM0 through SM3, while being separated at the boundaries between the sub memory arrays SM0 through SM3. The sub-bit-line contacts CH are connected to the sub bit lines SBL, for example, through openings in the plate electrodes PL in each of the sub memory arrays SM0 through SM3. (A so-called CUB memory cell structure in which the memory cell capacitors Cs are located under the sub bit lines SBL is employed in this embodiment, but the present invention is not limited to this and is applicable to a so-called COB memory cell structure, for example).

As shown in FIGS. 5 and 6, three-level metal interconnection layers are stacked above the plate electrodes PL. The sub bit lines SBL are included in the first-level metal interconnection layer, the main bit lines MBL are included in the second-level metal interconnection layer, and the word-line backing lines WL_M and the bit-line-selecting-line backing lines KS_M are included in the third-level interconnection layer. As shown in FIG. 4, the sub bit lines SBL and the main bit lines MBL extend perpendicularly to the word lines WL and overlap each other. The word-line backing lines WL_M and the bit-line-selecting-line backing lines KS_M extend along the word lines WL.

Specifically, as shown in FIGS. 5 and 6, for example, the semiconductor substrate has a triple-well structure in which a deep n-type well region NT and a p-well region PW are stacked on a p-type silicon substrate P-sub. The substrate including the memory cell gates TG of the memory cells MC and the bit-line connecting gates SW is separated from the substrate including a circuit region except for a memory cell region. It should be noted that the present invention is not limited to the triple-well structure, and the same advantage are obtained when a twin-well structure, for example, is employed.

The memory cell gates TG and the bit-line connecting gates SW have the same device structure and the same device size and are fabricated through the same processes. The memory cell gates TG and the bit-line connecting gates SW are formed by forming the n-type doped regions OD near the surface of the p-well region PW and then providing the word lines WL or the bit-line selecting lines KS as gate electrodes with the gate oxide film Gox interposed therebetween.

To substantially reduce the resistance, the word lines WL and the bit-line selecting lines KS are respectively connected to the word-line backing lines WL_M and the bit-line-selecting-line backing lines KS_M mainly composed of, for example, copper in a backing-line connection region which is not shown. The main component of these backing lines is not limited to copper and a certain level of resistance reduction is obtained as long as the metal interconnection such as aluminum is used.

The surfaces of the gate, source and drain electrodes of polysilicon in the memory cell gates TG and the bit-line connecting gates SW are silicided with a metal such as cobalt or nickel in order to reduce parasitic capacitance, for example. However, the present invention is not limited to such silicidation.

In addition, the storage electrodes SN and the plate electrodes PL of the memory cell capacitors Cs have an MIM structure using a metal such as tungsten so that the resistance of the storage contacts CA is reduced.

Such resistance reduction is not necessary, but this reduction compensates for decrease in access speed caused by serial connection of the memory cell gates TG and the bit-line connecting gates SW during access to the memory cell capacitors Cs, thus easily achieving high-speed access performance.

Then, word-line driving circuits WD for driving the word lines WL and the bit-line-selecting-line driving circuits KD for driving the bit-line selecting lines KS will be described with reference to FIG. 7. These driving circuits are formed of, for example, CMOS.

In the sub memory array SM0, for example, in a region corresponding to four word lines WL, four word-line driving circuits WD for driving these word lines WL are provided. One of these word-line driving circuits WD outputs a driving signal at a time based on a decoded result of an address signal.

On the other hand, at the boundary between the sub memory arrays SM0 and SM1, for example, in a region corresponding to four bit-line selecting lines KS arranged at the same pitch as the word lines WL, two bit-line-selecting-line driving circuits KD for driving these bit-line selecting lines KS are provided. These bit-line-selecting-line driving circuits KD commonly output driving signals to selected two of the four bit-line selecting lines KS based on a decoded result of a block selection input signal.

The load capacity of each of the bit-line-selecting-line driving circuits KD is about two to four times as large as that of each of the word-line driving circuits WD. On the other hand, four word-line driving circuits WD are formed in the region corresponding to four word lines WL as described above, whereas only two bit-line-selecting-line driving circuits KD are formed in the region with the same size.

That is, speed performance of a DRAM greatly depends on a signal transition time, which is determined by a relationship among the internal resistance of a driving circuit, a resistive load of a signal to be driven and a capacitive load. In view of this, each of the driving circuits has current driving ability according to the ratio in load capacity (i.e., current driving ability about twice as large as that of the word-line driving circuit WD), thereby easily balancing the transition time of a driving signal without an increase in layout area.

As described above, the regularly-arranged memory cells MC have symmetry such that four word lines or four bit-line selecting lines KS serve as a set, and each two of the four word lines, for example, serve as a pair. Each pair of the memory cell gates TG610 and TG620 and the memory cell gates TG611 and TG621 (see FIG. 2), for example, of adjacent memory cells MC shares an end of source/drain electrodes connected to the sub bit lines. Each pair of the gates TG630 and SW00, the gates TG631 and SW01, the gates /SW00 and /SW10, and the gates /SW01 and /SW11, for example, shares an end of source/drain electrodes. It should be noted that the memory cell gates TG of the memory cells MC and the bit-line connecting gates SW between the sub bit lines and the main bit lines have the same device structure and the same device size.

In the DRAM with the above-described hierarchical bit-line architecture, in the main memory array MM including, for example, four sub memory arrays SM, the bit-line connecting gate series SW and /SW are provided in two regions and, thereby, occupy an area corresponding to half of the number of sub bit lines.

Accordingly, in the DRAM with the hierarchical bit-line architecture of the first embodiment, the memory cell gates TG of the memory cells MC and the bit-line connecting gates SW between the sub bit lines and the main bit lines are continuously formed at the same pitch in the sub memory arrays SM0 and SM1, thus maintaining continuity of the layout pattern. As a result, a DRAM with a high yield is easily fabricated with a chip area reduced.

<<Modified Example of Embodiment 1>>

Figure 8:
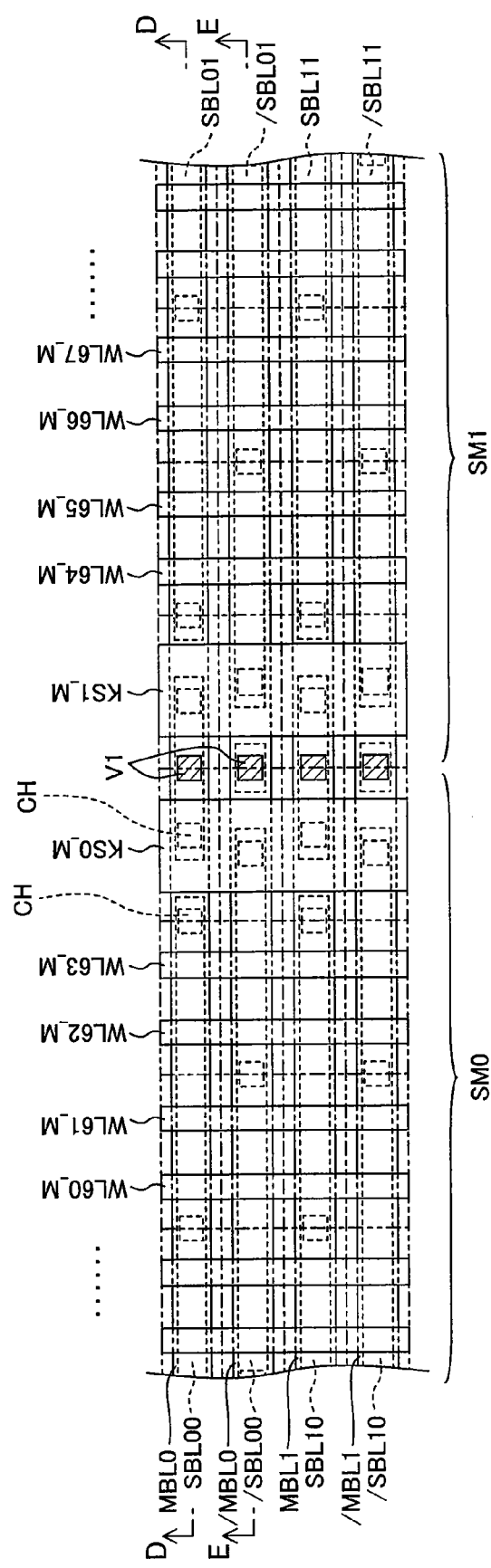
FIG. 8 is a cross-sectional view of a modified example of the first embodiment corresponding to FIG. 4.

Since each two of the bit-line selecting lines KS transmit an identical driving signal, the bit-line-selecting-line backing lines KS_M do not necessarily have a width corresponding to the bit-line selecting lines KS, and may be shared by two bit-line selecting lines KS and have a large width as shown by reference numerals KS0_M and KS1_M in FIG. 8 to further reduce the resistance. Specifically, this line width is determined by the pitch of the word lines and the design rule and may be about two to three times as large as that of the word-line backing lines WL_M, for example.

Embodiment 2

Figure 9:
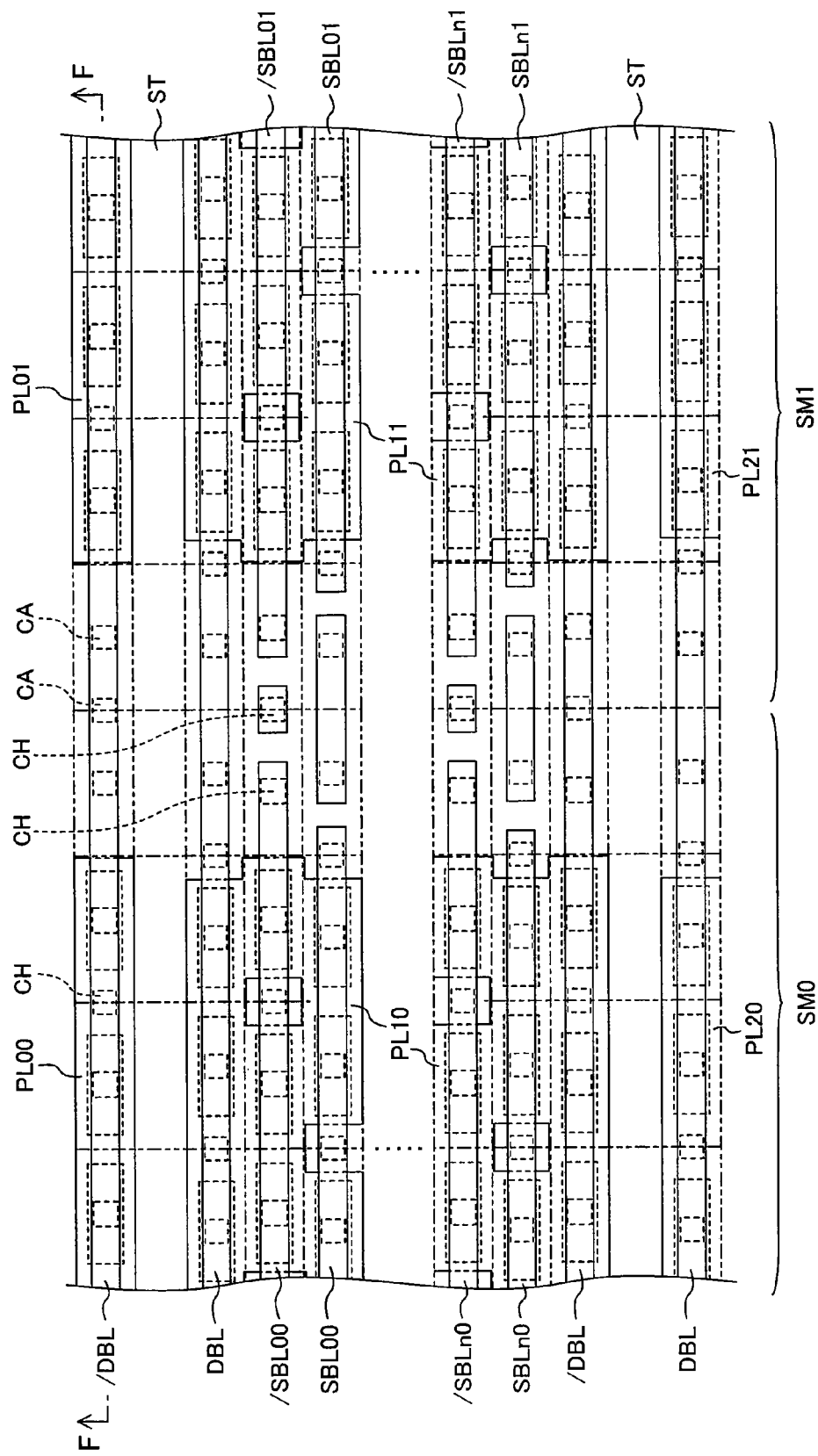
FIG. 9 is a cross-sectional view of a second embodiment corresponding to FIG. 3 for the first embodiment.

As illustrated in FIG. 9, in a DRAM according to a second embodiment, dummy bit lines DBL are adjacent to backing-line connection regions ST and extend across a main memory array MM. The dummy bit lines DBL are arranged at the same pitch as sub bit lines SBL and included in an interconnection layer including the sub bit lines SBL. In the backing-line connection regions ST, word lines WL, and bit-line selecting lines KS are connected to word-line backing lines WL_M and bit-line-selecting-line backing lines KS_M, respectively.

Plate electrodes PL00, PL10, and PL20 of memory capacitors Cs are separated from plate electrodes PL01, PL11, and PL21 of memory capacitors Cs in the directions of the sub bit lines SBL at the boundary between sub memory arrays SM0 and SM1. These plate electrodes are also separated from each other in the directions of the word lines WL by the backing-line connection regions ST. Though separated from one another, the plate electrodes are connected to each other in the following manner.

Figure 10:
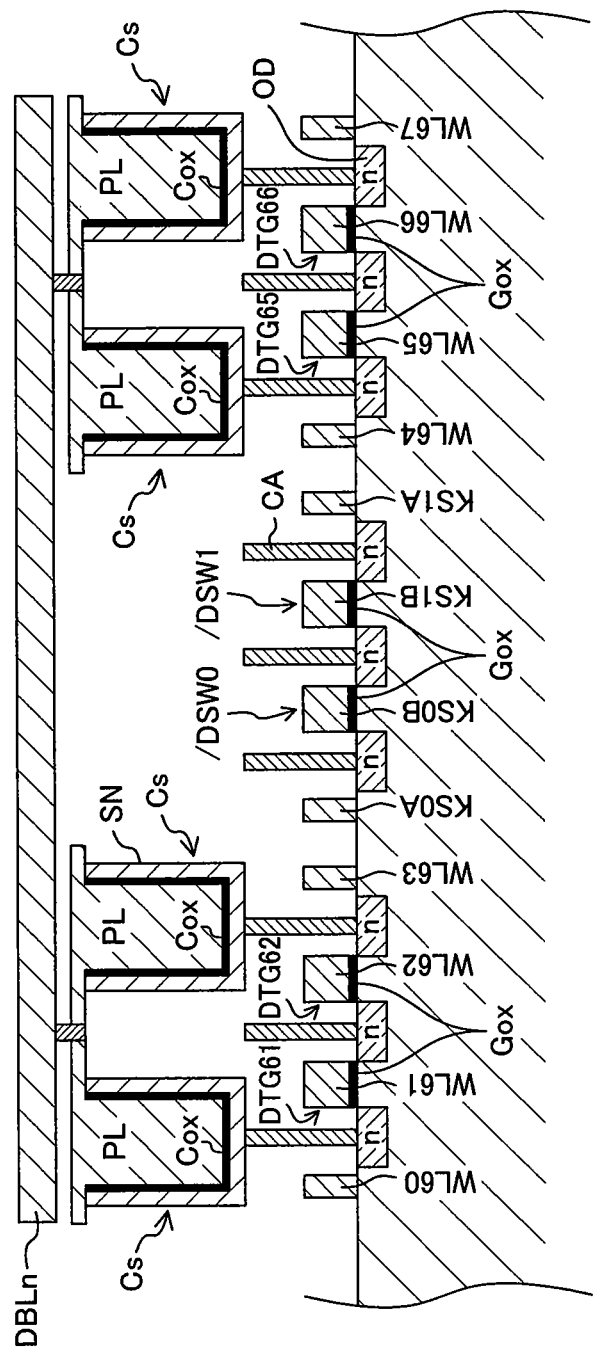
FIG. 10 is a cross-sectional view of the second embodiment corresponding to FIG. 6 for the first embodiment

On the dummy bit lines DBL, a large number of contacts similar to sub-bit-line contacts CH on the sub bit lines SBL are formed at the same pitch. The sub-bit-line contacts CH connect the source/drain electrodes of memory cell gates TG to the sub bit lines SBL through openings in the plate electrodes PL as described in the first embodiment, whereas those contacts of this embodiment connect the plate electrodes PL to the dummy bit lines DBL because no openings are formed in the plate electrodes PL as shown in FIG. 10. Accordingly, the plate electrodes PL10 and PL11, for example, are connected to each other along the sub bit lines SBL via the contacts and the dummy bit lines DBL. In addition, since no openings (no cutouts) are formed in a portion of the plate electrodes PL corresponding to the dummy bit lines as described above, the ends of the plate electrodes PL are made linear. (Since no plate electrodes are formed in memory cell gate regions of the sub bit lines and the main bit lines, no sub-bit-line contacts CH are formed on the dummy bit lines.)

The dummy bit lines DBL are connected to each other by, for example, an interconnection layer at a higher level (not shown). Accordingly, the plate electrodes PL00, PL10, and PL20, for example, are also connected to each other along the word lines WL.

As described above, in general, the plate electrodes PL which have been divided into a plurality of portions in the main memory array are connected to each other with a low resistance via the dummy bit lines DBL originally expected to serve simply as optical dummies, thereby readily enhancing resistance to noise caused by, for example, a variation in potential of the plate electrodes PL during operation. Accordingly, it is possible to provide a DRAM with a small layout area, excellent speed performance and noise immunity and high yield, allowing easy fabrication of the DRAM.

Embodiment 3

Figure 11:
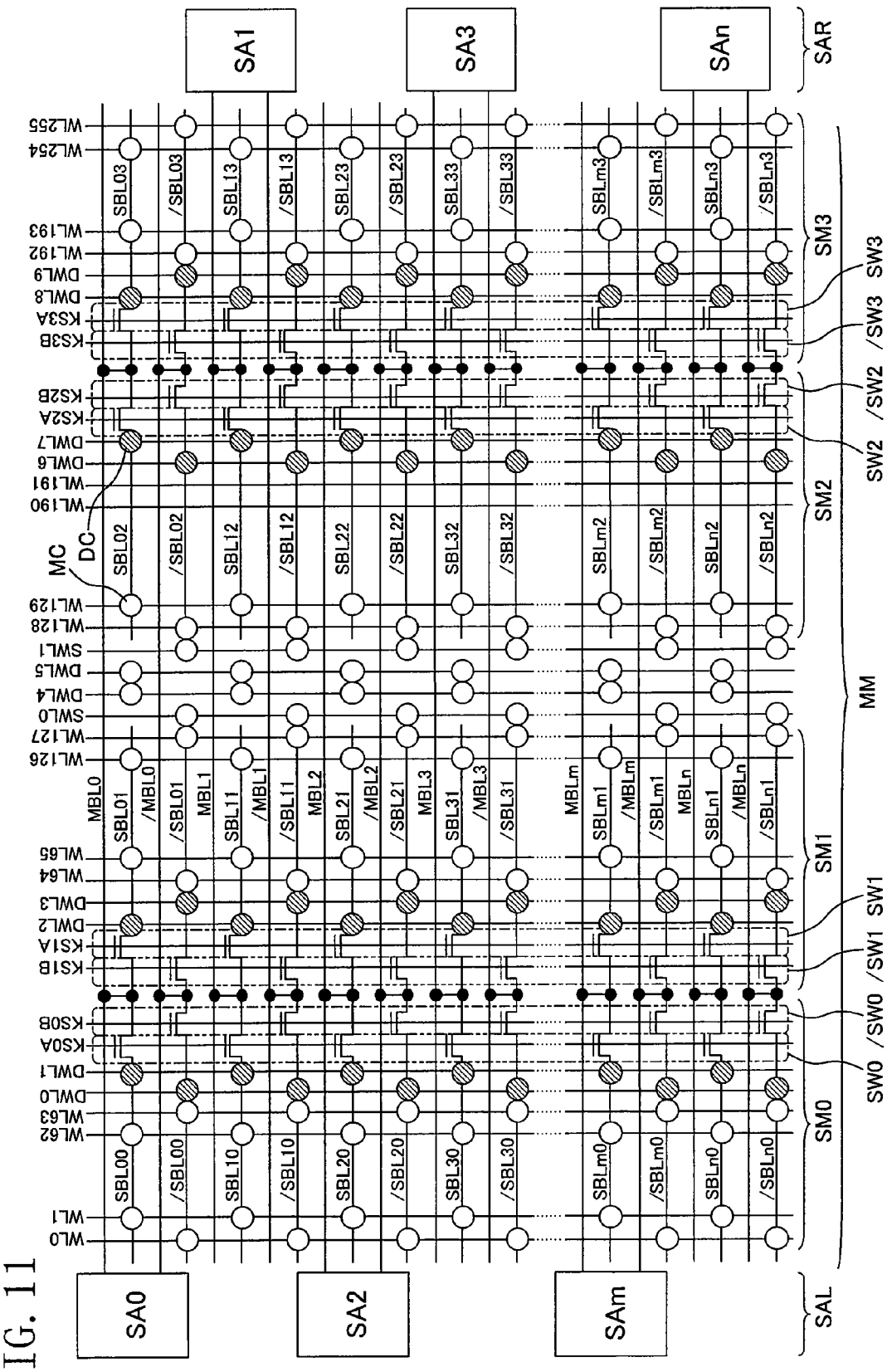
FIG. 11 is a circuit diagram illustrating a configuration of a DRAM according to a third embodiment.

A DRAM according to a third embodiment will be described with reference to FIGS. 11 through 13.

The third embodiment is different from the first embodiment mainly in the aspects described below except for, for example, a structure in which respective ones of source/drain electrodes connected to sub bit lines SBL are shared in adjacent memory cell gates TG in each sub memory array SM0 . . . .

A pair of two dummy word lines DWL0 and DWL1, DWL2 and DWL3, DWL6 and DWL7 or DWL8 and DWL9 is provided between a word line WL and a bit-line selecting line KS at the boundary between sub memory arrays SM0 and SM1 or between sub memory arrays SM2 and SM3.

At the boundary between the sub memory arrays SM1 and SM2, two dummy word lines DWL4 and DWL5, and two auxiliary word lines SWL0 and SWL1 connected to auxiliary memory cells are provided between word lines WL127 and WL129.

Further, the correspondence between word lines WL and sub bit lines SBL in locating memory cells MC is different between the first embodiment and the third embodiment. Specifically, in the first embodiment, for example, the memory cells MC are located at the intersections of the word lines WL0, WL3, WL4, WL7, WL8, . . . , and the sub bit line SBL00, whereas in this second embodiment, the memory cells MC are located at the intersections of the word lines WL2, WL3, WL6, WL7, . . . , and the word line WL0. However, the relative pattern is the same and the above difference is not an essential feature of the present invention.

Dummy memory cells including only memory cell gates TG and including no memory cell capacitors Cs are provided at the intersections of the dummy word lines DWL0 through DWL3 and DWL6 through DWL9, and the sub bit lines SBL at the boundaries between the sub memory arrays SM0 and SM1 and between SM2 and SM3. (The dummy word lines DWL0 . . . serve as gate electrodes of the above memory cell gates TG.) The dummy word lines DWL0 . . . are grounded so that the memory cell gates TG are OFF.

Figure 12:
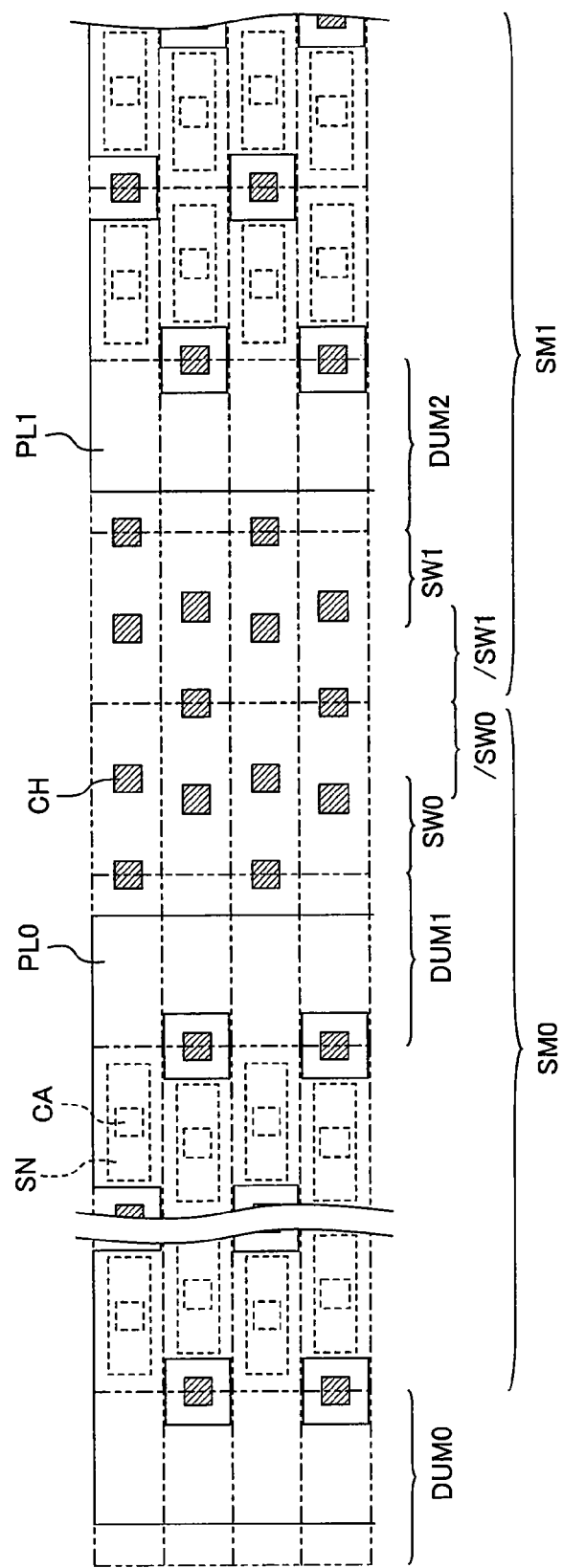
FIG. 12 is a cross-sectional view of the third embodiment corresponding to FIG. 3 for the first embodiment.
Figure 13:
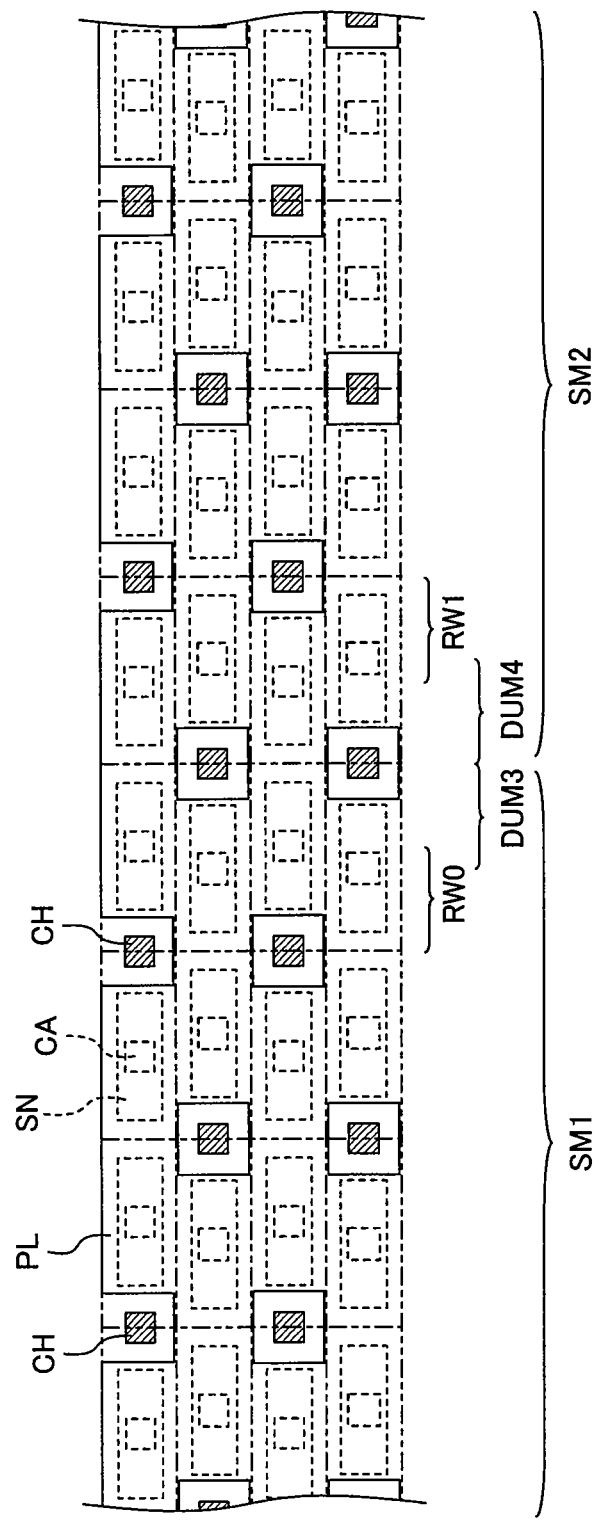
FIG. 13 is another cross-sectional view illustrating the third embodiment corresponding to FIG. 3 for the first embodiment.

Since the dummy word lines DWL are additionally provided at the boundaries between the sub memory arrays SM0 and SM1 and between SM2 and SM3 where the bit-line selecting lines KS are provided as described above, the ends of plate electrodes PL0 and PL1 are made linear as shown in FIG. 12, for example. Specifically, openings for inserting sub-bit-line contacts CH do not need to be formed on the plate electrodes PL0 and PL1 in dummy memory cell regions DUM0 . . . , thus eliminating a necessity for forming cutouts as described in the first embodiment (FIG. 3). Accordingly, various conditions in fabrication processes are allowed to be optimally adapted to openings, so that enhancement of accuracy, for example, is more easily achieved.

The memory cells MC including the memory cell gates TG and the memory cell capacitors Cs are provided at the intersections of the dummy word lines DWL4 and DWL5 and the sub bit lines SBL at the boundary between the sub memory arrays SM1 and SM2, in the same manner as the word lines WL. However, the dummy word lines DWL4 and DWL5 are also grounded so that the memory cell gates TG are OFF and are not used as effective storage devices. Respective ones of source/drain electrodes of the memory cell gates TG whose gate electrodes are connected to the adjacent dummy word lines DWL4 and DWL5 are integrally formed but are not connected to the main bit lines MBL.

The above-mentioned dummy word lines DWL4 . . . are provided because if the word lines WL127 and WL128 were directly adjacent to each other and the source/drain electrodes of the memory cell gates TG connected to these word lines WL127 and WL128 were shared, it would be difficult to separately connect the memory cell gates TG to the respective sub bit lines SBL01 and SBL02. In view of this, the arrangement of the dummy word lines DWL4 . . . as described above enables the memory cell gates associated with the word lines WL127 and WL128 to be separately connected to the sub bit lines SBL01 and SBL02 and also enables storage electrodes SN, storage contacts CA, sub-bit-line contacts CH, transistors and other components to be regularly arranged in dummy memory cell regions DUM2 and DUM3 (and redundant memory cell regions RW0 and RW1) as in the other regions as shown in FIG. 13, thus easily maintaining uniformity in the layout pattern.

Basic purposes of providing the auxiliary memory cells and the auxiliary word lines SWL as described above are the same as those for a general DRAM. Specifically, a large-capacity DRAM generally includes auxiliary memory cells for recovery by replacement of defective memory cells in order to increase the yield. The auxiliary memory cells are arranged in rows and columns and are replaced in units of rows or columns. In the third embodiment, in addition to such general enhancement of the yield, the auxiliary word lines SWL0 and SWL1 as described above allow the chip area to be easily reduced. More specifically, only two dummy word lines at the boundary between the sub memory arrays SM1 and SM2 are enough to meet their purpose. However, to maintain uniformity in the layout pattern, the pattern is preferably formed of four word lines as a unit. In view of this, the auxiliary word line SWL0 adjacent to the word line WL127 and the auxiliary word line SWL1 adjacent to the word line WL128 are provided so that enhancement of the yield and uniformity in the layout pattern are achieved at the same time. In addition, the auxiliary word lines are effectively arranged, thus also achieving reduction in chip area of a DRAM with a hierarchical bit-line architecture.

In the third embodiment, two auxiliary word lines are provided for each main memory array. However, a larger number of auxiliary word lines may be provided as long as uniformity in the layout pattern is maintained. The minimum unit for maintaining uniformity in the layout pattern is preferably four. The number of auxiliary word lines is preferably optimized in view of a trade-off between defect density during fabrication and the chip area.

With respect to the dummy word lines, dummy memory cells are generally arranged in the periphery of memory cells arranged in an array. This is because unevenness in a mask pattern mainly in transferring the mask pattern during fabrication deforms the shape of the pattern under the influence of light intensity, thus failing to obtain a desired pattern shape.

Therefore, a pattern which is ineffective as a storage device is provided as an optical dummy in the periphery of a pattern which is effective as a storage device, thereby uniformly forming the pattern which is effective as a storage device. In this embodiment, such peripheral dummy memory cells may be provided.

Embodiment 4

Figure 14:
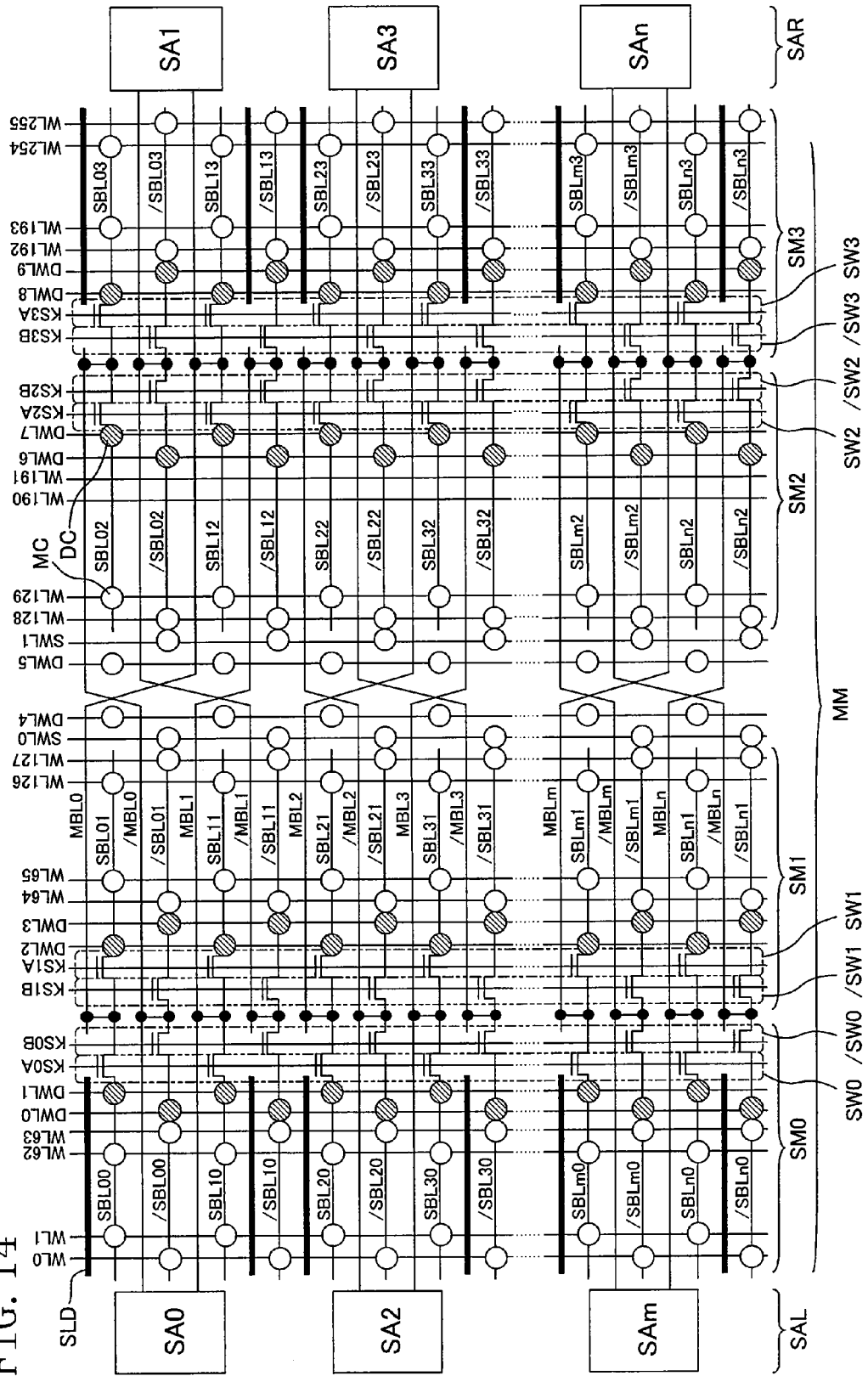
FIG. 14 is a circuit diagram illustrating a configuration of a DRAM according to a fourth embodiment.

A DRAM according to a fourth embodiment will be described with reference to FIG. 14.

The fourth embodiment is different from the third embodiment in the configuration of pairs of main bit lines mainly in the following manner.

Specifically, in the third embodiment, a pair of main bit lines MBL and /MBL extends in parallel, is connected to a sense amplifier SA, and is connected to a pair of sub bit lines provided in a row in a main memory array MM. On the other hand, the fourth embodiment is different in the following aspects. First, two adjacent pairs of main bit lines form a twisted structure at a higher layer than auxiliary word lines SWL0 and SWL1 and dummy word lines DWL4 and DWL5 at the boundary between sub memory arrays SM1 and SM2. Next, the pairs of main bit lines MBL and /MBL are not provided at both ends of the sub memory arrays SM. Lastly, a shield pattern SLD is formed in a region where no main bit lines are provided. The shield pattern SLD is included in an interconnection layer including the main bit lines.

In this fourth embodiment, the pairs of main bit lines have a twisted structure to reduce coupling noise between adjacent main bit lines.

The pairs of main bit lines are twisted in a region where auxiliary word lines SWL0 and SWL1 and dummy word lines DWL4 and DWL5 are provided so that a region where the sub bit lines are separated is effectively utilized to avoid an increase in layout area.

The pairs of main bit lines are preferably twisted at a midpoint of the main memory array as in the fourth embodiment. However, other twisted patterns may be employed. In such a case, coupling noise is also reduced.

Now, description is given on the length of the main bit lines. The pairs of main bit lines MBL and /MBL are longer than the pairs of sub bit lines SBL and /SBL (about four times longer in the first and third embodiments). On the other hand, in a structure in which the sense amplifiers associated with the pairs of main bit lines are arranged at one end of the main memory array, the pattern of the main bit lines does not need to be formed on a sub memory array at the other end of the main memory array and only needs to extend to a portion where the main bit lines and the sub bit lines at the other end are connected. Thus, the main bit lines are allowed to be shorter accordingly so that parasitic capacitance is reduced.

Accordingly, the ratio of a total capacitance Cb of the sub bit lines and the main bit lines to a memory cell capacitance Cs is reduced, so that the read-out voltage appearing on a pair of main bit lines is increased during read-out of data from a memory cell, thereby enhancing the operation margin.

In a structure in which the sense amplifiers are alternately provided at both ends of the main memory array for the respective pairs of main bit lines as in the fourth embodiment, the pitch of the pairs of main bit lines in the sub memory arrays at both ends is twice as large as that in the other sub memory arrays.

In addition, a line pattern in which lines are arranged at the same pitch as the pairs of main bit lines is formed in an interconnection layer including the pairs of main bit lines in a region where no pairs of main bit lines are formed, and is fixed at the same potential as a precharge potential of the main bit lines. This further reduces the influence of coupling noise between adjacent main bit lines and substantially balances the amounts of coupling charge of a pair of main bit lines.

With the foregoing configuration of the DRAM with the hierarchical bit-line architecture according to the fourth embodiment, a DRAM with a large operation margin is implemented without an increase in layout area.

Embodiment 5

Figure 15:
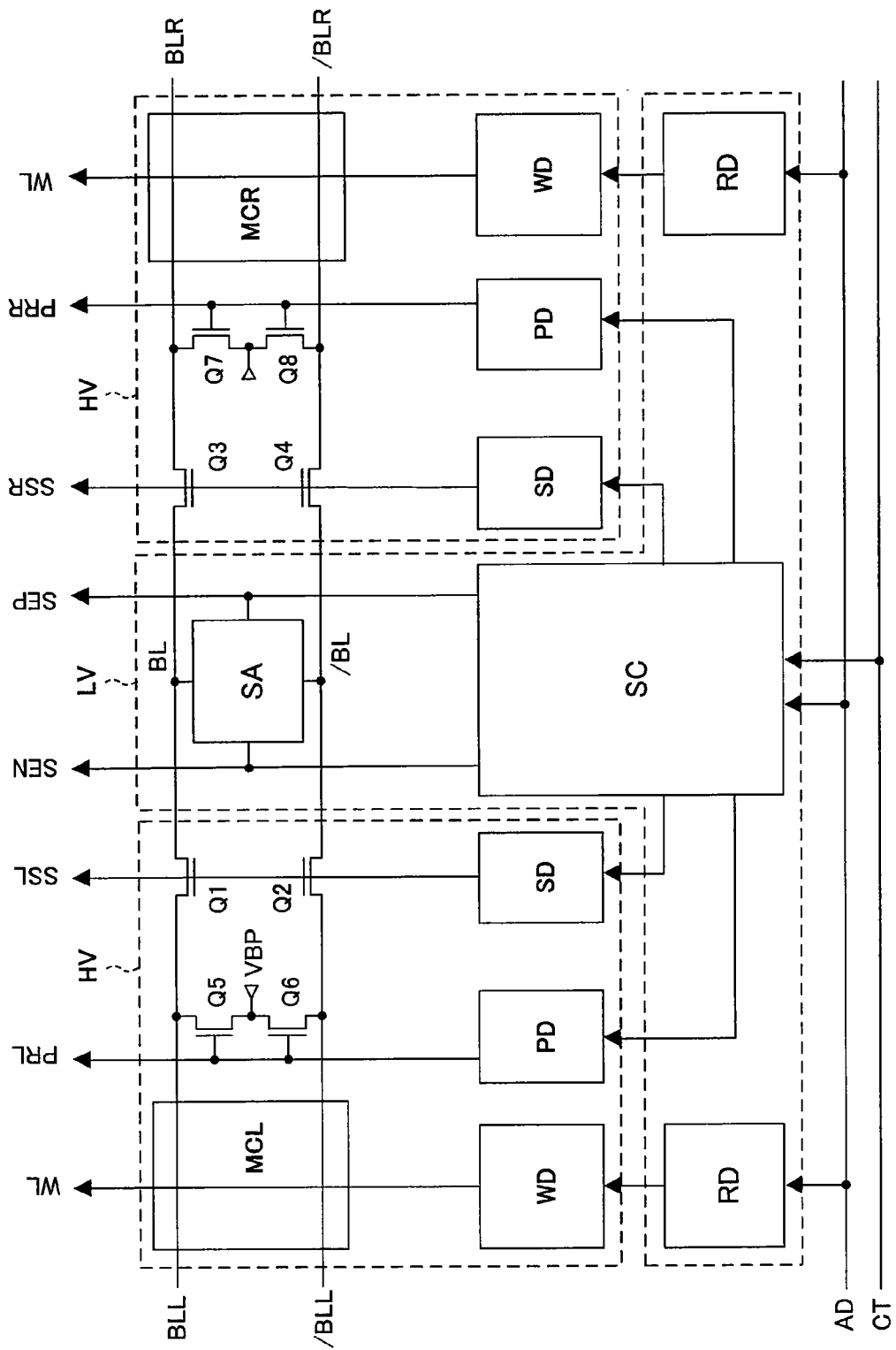
FIG. 15 is a connection diagram partially illustrating a configuration of a DRAM according to a fifth embodiment.

FIG. 15 is a connection diagram partially illustrating a configuration of a DRAM according to a fifth embodiment of the present invention.

In FIG. 15, the DRAM of the present invention has a shared sense amplifier structure including: a memory cell array MC in which dynamic memory cells provided near the intersections of a plurality of word lines WL and a plurality of pairs of bit lines BLL and /BLL (BLR and /BLR) are arranged in an array; a sense amplifier circuit SA for sense amplifying a potential difference between the pair of bit lines BL and /BL; a bit-line precharge circuit for supplying a precharge potential to the pair of bit lines BL and /BL; switches (shared switch transistors) Q1, Q2, Q3, and Q4 for controlling connection between the pair of bit lines BL and /BL and the sense amplifier; word-line driving circuits WD; decoders RD; precharge-control-signal driving circuits (voltage converters) PD; shared-switch-control-signal driving circuits (voltage converters) SD; and a sense-amplifier control circuit SC.

A signal associated with selection of word lines out of a plurality of address signals AD is input to the decoder RD and an output from the decoder is input to the word-line driving circuits WD so that one of the word lines WL is selected. A signal associated with selection of a sense amplifier block out of the address signals AD and a sense-amplifier control signal CT are input to the sense-amplifier control circuit SC, thereby outputting sense-amplifier driving signals SEN and SEP. Precharge control signals PRL and PRR are output from the precharge-control-signal driving circuits PD to the gate electrodes of precharge transistors Q5, Q6, Q7, and Q8 to control connection between a pair of bit lines and a precharge power supply VBP. Shared-switch control signals SSL and SSR are output from the shared-switch-control-signal driving circuits SD to the gate electrodes of the shared switch transistors Q1, Q2, Q3, and Q4 to control connection of a pair of bit lines and the sense amplifier. The precharge control signals PRL and PRR and the shared-switch control signals SSL and SSR are selectively controlled according to a signal associated with selection of a sense amplifier block out of a plurality of address signals AD. The precharge power supply VBP is set at about ½ of the amplitude level of, for example, bit lines.

A voltage higher than the amplitude level of bit lines is generally applied to a gate electrode of a transfer gate of a memory cell in order to write a high level of a bit line to a memory cell capacitor. Though not shown, transfer gates of the memory cells are made of n-type transistors and have gate insulating films thicker than those of transistors forming the sense amplifier SA.

For the high level of precharge control signals PRL and PRR connected to the gate electrodes of the precharge transistors Q5, Q6, Q7, and Q8, a potential at the same level as a high level of a word line is supplied. As the shared-switch control signals SSL and SSR connected to the gate electrodes of the shared switch transistors Q1, Q2, Q3, and Q4, the potential at the same level as the high level of a word level is also supplied. Accordingly, the gate insulating films of the precharge transistors Q5, Q6, Q7, and Q8 and the shared switch transistors Q1, Q2, Q3, and Q4 have the same thickness as the gate insulating films of the transfer gates of the memory cells and are thicker than those of transistors forming the sense amplifier SA.

In addition, the word-line driving circuits WD, the precharge-control-signal driving circuits PD and the shared-switch-control-signal driving circuits SD include voltage converters for converting the amplitudes of signals input with low voltages into the signal amplitudes with high voltages. The gate insulating films of at least output-signal driving transistors have the same thickness as the gate insulating films of the transfer gates of the memory cells.

That is, transistors included in a circuit block to which a high voltage is applied are formed within a high-breakdown-voltage region HV with thick gate insulating films, whereas transistors included in a circuit block to which only a low voltage is applied are formed within a low-breakdown-voltage region LV with thin gate insulating films. More specifically, the gate insulating films of the transistors in the high-breakdown-voltage region HV have a thickness of approximately 7.5 nm, and an applied voltage is approximately 3.3V. The gate insulating films of the transistors in the low-breakdown-voltage region LV have a thickness of approximately 2.2 nm, and an applied voltage is approximately 1.2V.

Figure 18:
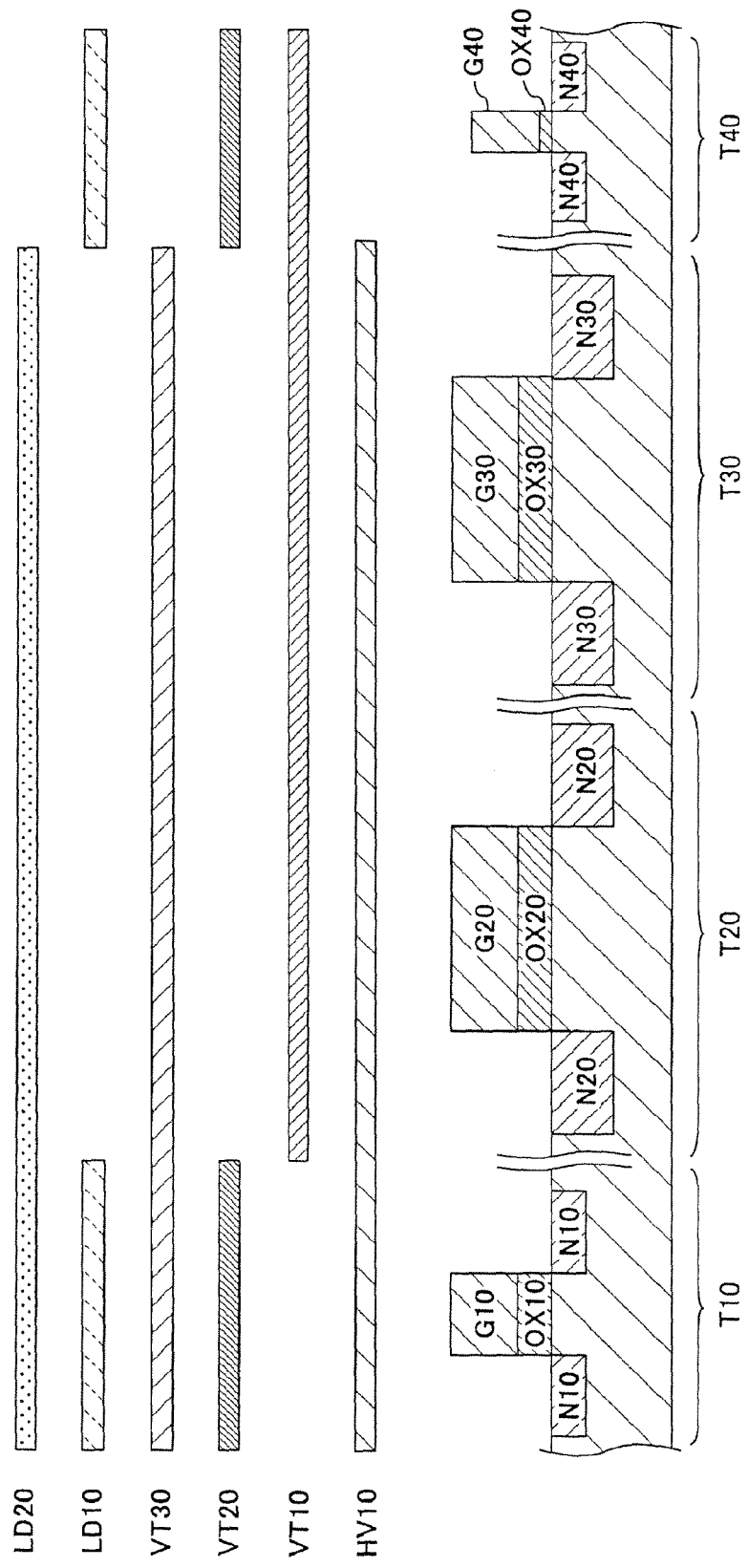
FIG. 18 shows a partial section of a conventional DRAM and also shows part of photomasks used in fabrication in association with the partial section.

FIG. 18 shows a partial section of a conventional DRAM and also shows part of photomasks used in fabrication in association with the partial section. In FIG. 18, partial sections of memory cell regions MCL and MCR are shown in a region T10, partial sections of shared switch transistors Q1, Q2, Q3, and Q4 and precharge transistors Q5, Q6, Q7, and Q8 are shown in a region T20, partial sections of word-line driving circuits WD, precharge-control-signal driving circuits PD and shared-switch-control-signal driving circuits SD are shown in a region T30, and partial sections of decoders RD, a sense-amplifier control circuit SC, and a sense amplifier SA are shown in a region T40.

A DRAM generally uses a plurality of different power supply voltages. For example, in a DRAM having two power supplies, one of which is 3.3V and the other is 1.2V, a photomask HV10 is used to control the thicknesses of gate insulating films such that gate-electrode insulating films OX10, OX20, and OX30 have a large thickness in the regions T10, T20, and T30 whose gate electrodes receive 3.3V, whereas a gate-electrode insulating film OX40 has a small thickness in the region T40 whose gate electrode receives 1.2V. In the regions T20 and T30, the channel lengths of MOSFETs are set larger than those in the regions T10 and T40 and the minimum channel lengths in the regions T20 and T30 are set uniform in order to suppress a short-channel effect and ensure hot carrier tolerance.

In the region T40, since the gate electrode and the source/drain electrodes operate at 1.2V or less, the channel length of the MOSFET is set small to enhance current driving ability per unit channel width. That is, the relationship of G30=G20>G10>G40 is established. The threshold voltages and the LDD structures in the regions are also independently controlled between the regions T10 and T20 and between the regions T30 and T40, so that ion implantation is controlled using photomasks VT10, VT20, VT30, LD10, and LD20.

Figure 16:
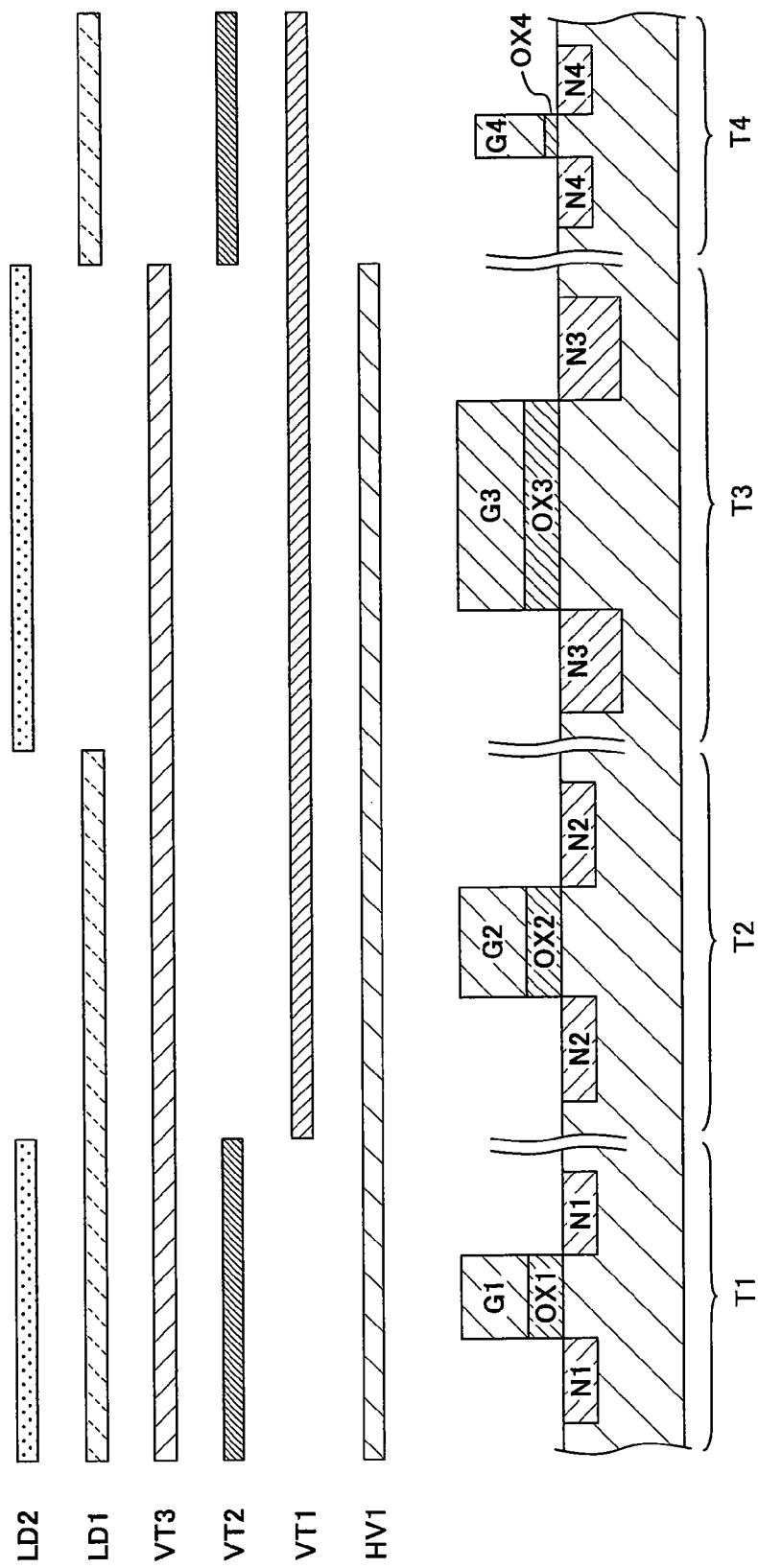
FIG. 16 shows a section specifically illustrating a part shown in FIG. 15 and also shows part of photomasks used in fabrication in association with the partial section.

FIG. 16 shows a partial section of the DRAM of the fifth embodiment and also shows part of photomasks used in fabrication in association with the partial section. The structures of the substrate and the metal interconnection are not material to the present invention and, thus, are not specifically shown.

Comparing FIGS. 15 and 16 with each other, partial sections of the memory cell regions MCL and MCR are shown in a region T1, partial sections of the shared switch transistors Q1, Q2, Q3, and Q4 and the precharge transistors Q5, Q6, Q7, and Q8 are shown in a region T2, partial sections of the word-line driving circuits WD, the precharge-control-signal driving circuits PD and the shared-switch-control-signal driving circuits SD are shown in a region T3, and partial sections of the decoders RD, the sense-amplifier control circuit SC, and the sense amplifier SA are shown in a region T4.

The regions T1, T2, T3, and T4 shown in FIG. 16 are n-transistor regions and made of transistors with MOSFET structures. The regions T1, T2, T3, and T4 do not always appear on the same section actually, but these regions are shown on the same section for convenience of description.

A gate insulating film OX1 in the region T1, a gate insulating film OX2 in the region T2 and a gate insulating film OX3 in the region T3 are formed through the same process and have an identical thickness. A gate insulating film OX4 in the region T4 is formed through a process different from that for the gate insulating films OX1, OX2, and OX3 and is different in thickness from these gate insulating films. The thickness relationship among the gate insulating films is GOX1=GOX2=GOX3>GOX4. The thicknesses of the gate insulating films are selectively controlled in a process using a photomask HV1.

The channel lengths of the MOSFETs in the regions T1, T2, T3, and T4 are set as G3>G2>G1>G4. A feature of this embodiment is that the channel length of G2 is smaller than that of G3, as compared to the conventional example. The gate electrodes of the shared switch transistors Q1, Q2, Q3, and Q4 and the precharge transistors Q5, Q6, Q7, and Q8 in the region T2 receive control signals of 3.3V, whereas the source/drain electrodes thereof are connected to bit lines or bit-line precharge power supplies and receive signals of 1.2V or less. Accordingly, a short channel effect and hot carrier tolerance are greatly reduced as compared to those upon an application of 3.3V, thus enabling reduction in channel length.

In addition, a photomask LD2 is used to form the structure of source/drain electrodes N2 of the MOSFET in the region T2 through the same process as source/drain electrodes N4 of the MOSFET in the region T4. The photomask LD2 does not cover the regions T2 and T4 so as to selectively form the source/drain electrodes in the regions T2 and T4. A photomask LD1 is used to form source/drain electrodes of the MOSFET in the region T3 independently of those in the other regions. The photomask LD1 exposes only the region T3 so as to selectively form the source/drain electrodes in the region T3.

To determine the threshold voltages of the MOSFETs in the respective regions, photomasks VT1, VT2, and VT3 for setting threshold voltages are used. The photomask VT1 exposing only the region T1 and the photomask VT3 exposing only the region T4 are used for the respective regions so as to determine the threshold voltages in the regions T1 and T4 independently of the other regions. With respect to the regions T2 and T3, the photomask VT2 is commonly used to perform ion implantation in the same fabrication process. The reason why the ion implantation for determining the threshold voltage in the region T2 is not commonly performed for the region T4 is that the thickness of the gate insulating film differs between the regions T2 and T4, i.e., the gate insulating film OX2 in the region T2 is thicker than the gate insulating film OX4 in the region T4, and thus the same amount of ion implantation and the same implantation energy would cause the threshold voltage in the region T2 to be too low to obtain sufficient switching characteristics Specifically, the thickness relationship among the gate insulating films OX1, OX2, OX3, and OX4 of the MOSFETs in the regions T1, T2, T3, and T4 is GOX1=GOX2=GOX3>GOX4 and the relationship among the channel lengths G1, G2, G3, and G4 of the respective MOSFETs is G3>G2>G1>G4. With respect to the threshold voltages of the MOSFETs, the photomask VT1 is used for the region T1, the photomask VT3 is used for the region T4 and the gate insulating films in these regions are formed through different processes independently of each other, and the photomask VT2 is commonly used for the regions T2 and T3 to form the gate insulating films in these regions through the same process. Moreover, regarding the source/drain electrodes of the MOSFETs, the photomask VT1 is used for the region T1, the photomask LD1 is used for the region T3 to form the source/drain electrodes in these regions through different processes independently of each other, and the photomask LD2 is commonly used for the regions T2 and T4 to form the source/drain electrodes in these regions through the same process.

In the DRAM with the foregoing structure, the channel lengths of the precharge transistors and the shared switch transistors are allowed to be reduced, thus achieving reduction in layout area. Since the precharge transistors and the shared switch transistors are provided for every memory cell arrays divided into a plurality of blocks. Thus, the advantages are enhanced as the amount of storage capacity and the number of division increase. Photomasks for determining threshold voltages and forming source/drain electrodes are allowed to be shared by a plurality of regions, so that the layout area is reduced without increase in number of processes and photomasks used in the processes.

Figure 17:
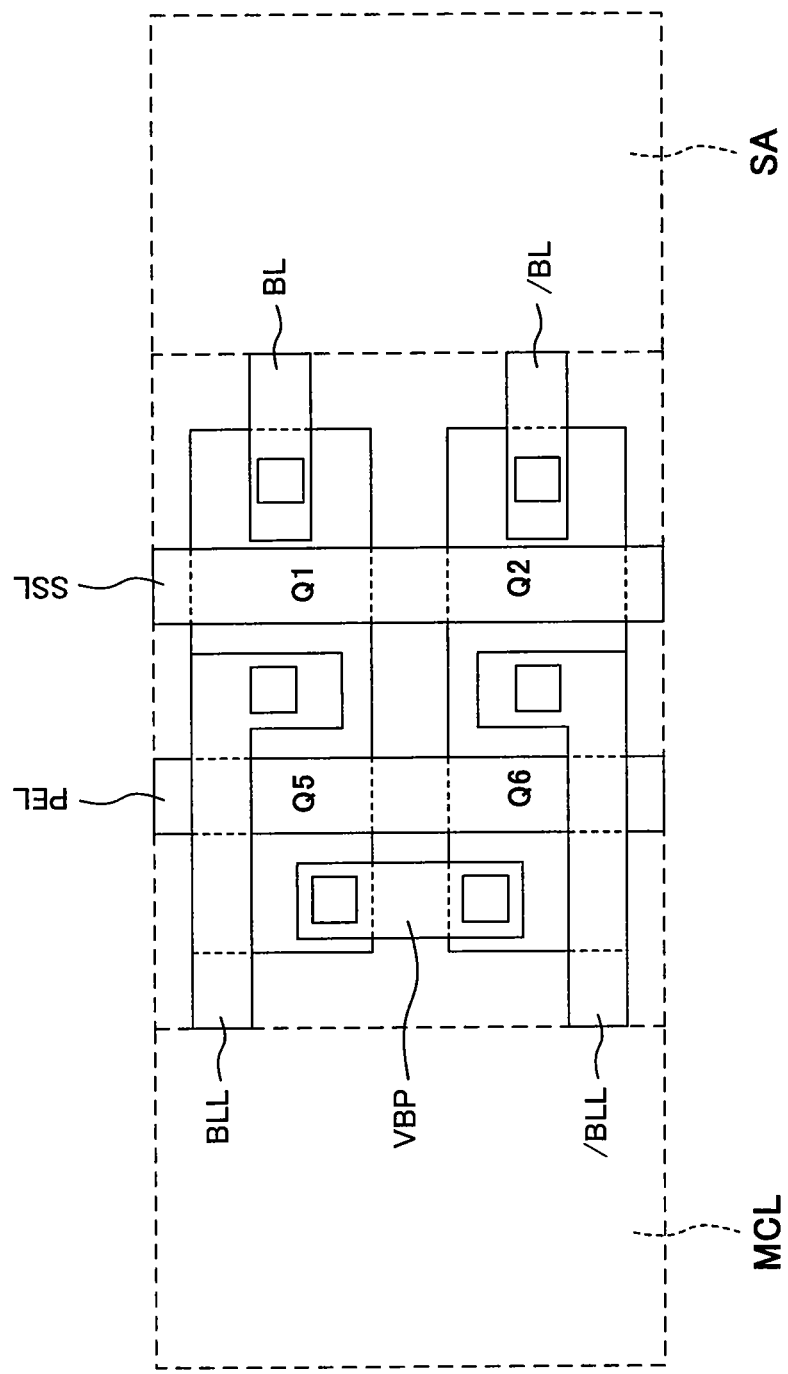
FIG. 17 is a plan view specifically showing the part illustrated in FIG. 15.

FIG. 17 is a plan view partially showing the DRAM of the fifth embodiment. The shared switch transistors Q1 and Q2 and the precharge transistors Q5 and Q6 are provided within the width of each sense amplifier SA. The shared switch transistors Q1 and Q2 serve as a pair. Respective ones of the source/drain electrodes of the transistors Q1 and Q2 are connected to a pair of bit lines BL and /BL in the sense amplifier SA and the others are connected to a pair of bit lines BLL and /BLL in the memory cell array MCL. The precharge transistors Q5 and Q6 serve as a pair. Respective ones of the source/drain electrodes of the transistors Q5 and Q6 are connected to the pair of bit lines BLL and /BLL in the memory cell array MCL and the others are commonly connected to a precharge power supply VBP. Though not shown, a plurality of bit lines in the memory cell array MCL are arranged at a pitch which is ½ of that of bit lines in the sense amplifier SA.

It is necessary to arrange the shared switch transistors Q1 and Q2 and the precharge transistors Q5 and Q6 at the same pitch as the sense amplifiers SA, and the maximum channel widths of the MOSFETs forming these transistors are restricted by the pitch of the memory cells and the sense amplifiers. In this fifth embodiment, the channel lengths of the MOSFETs forming the transistors Q1, Q2, Q3, and Q4 are allowed to be reduced, as compared to the conventional example, so that current driving ability per unit in each of the MOSFETs is enhanced. This increases the speed of data transfer between memory cells and sense amplifiers and the speed of precharge of bit lines.

In addition, a large number of shared switch transistors such as Q1 and Q2 are commonly connected to a control signal and a large number of precharge transistors such as Q5 and Q6 are also commonly connected to a control signal. Therefore, driving load capacities of the precharge-control-signal driving circuits and the shared-switch-control-signal driving circuits increase. To obtain high-speed operation, transistor sizes of the precharge-control-signal driving circuits and the shared-switch-control-signal driving circuits need to be increased, thus causing a trade-off between this increase and the layout area. However, in this fifth embodiment, the channel lengths of the MOSFETs forming the transistors Q1, Q2, Q3, and Q4 are allowed to be reduced as compared to the conventional example, thereby reducing driving load capacities of the precharge-control-signal driving circuits and the shared-switch-control-signal driving circuits. That is, high-speed operation is achieved without increase in layout area of the precharge-control-signal driving circuits and the shared-switch-control-signal driving circuits and, in addition, driving load capacities are reduced, thereby allowing reduction in power consumption.

With the DRAM of the fifth embodiment with the foregoing structure, reduction in layout area, enhancement of speed performance and reduction in power consumption are achieved at a time without an increase in number of fabrication processes.

In the fifth embodiment, the DRAM with a shared sense amplifier structure is described. Alternatively, a DRAM with non-shared sense amplifier structure may be employed. Even in such a case, the same advantages are obtained for precharge transistors. In the fifth embodiment, description is given on the DRAM having no equalization circuit for pairs of bit lines. However, the same advantages are also obtained for a DRAM with an equalization circuit. Further, in the DRAM of the fifth embodiment, the precharge circuits are closer to the memory cell than the shared switch circuits. Alternatively, the precharge circuits may be closer to the sense amplifier than the shared switch circuits. In such a case, the same advantages are also obtained.

The structure as described above is not limited to memories with the hierarchical bit-line architecture and the folded bit-line architecture as described in the first through fourth embodiments.

INDUSTRIAL APPLICABILITY

A semiconductor storage device according to the present invention enhances uniformity in the layout pattern on a semiconductor chip to suppress process variations during fabrication, thus easily achieving reduction in layout area and enhancement (maintenance) of the fabrication yield. Thus, the semiconductor storage device of the present invention is useful as a device such as a dynamic random access memory (DRAM) with a so-called hierarchical bit-line architecture in which a plurality of sub bit lines are provided for one main bit line.

The invention claimed is:
1. A semiconductor storage device, comprising:
a plurality of sub memory arrays each including a plurality of memory cells and sub bit lines, the memory cells including cell transistors;
main bit lines; and
bit-line connecting transistors for selectively connecting the sub bit lines to one of the main bit lines,
wherein the semiconductor storage device has a folded-bit-line architecture,
the sub memory arrays are arranged such that the sub bit lines are aligned along the main bit lines in a first direction,
a pattern formed of given numbers of the cell transistors and the bit-line connecting transistors is repeated, the main bit lines and the sub bit lines connected to one another via the bit-line connecting transistors overlap with one another in plane view along the length of the sub bit lines, and the main bit lines and the sub bit lines arranged abreast in a second direction which is perpendicular to the first direction are arranged at same intervals as one another.

2. The semiconductor storage device of claim 1, wherein the memory cells further include capacitors connected to the sub bit lines via the cell transistors, and the cell transistors and the bit-line connecting transistors are MOS transistors.

3. The semiconductor storage device of claim 2, wherein each of gate electrodes, source electrodes and drain electrodes of the MOS transistors has a silicide structure.

4. The semiconductor storage device of claim 2, wherein the cell transistors and the bit-line connecting transistors are adjacent to each other, and adjacent ones of the cell transistors and the bit-line connecting transistors share one of source and drain electrodes.

5. The semiconductor storage device of claim 2, further comprising:

a plurality of sets of the main bit lines and the sub memory arrays;

cell-transistor-control-signal lines intersecting the main bit lines and each connected to gate electrodes of corresponding ones of the cell transistors in the respective sub memory arrays in the sets of the main bit lines and the sub memory arrays;

bit-line-connecting-transistor-control-signal lines intersecting the main bit lines and each connected to gate electrodes of corresponding ones of the bit-line connecting transistors in the respective sub memory arrays in the sets of the main bit lines and the sub memory arrays; and each of the cell transistors and the bit-line connecting transistors is provided at an intersection of one of the main bit lines and an associated one of the cell-transistor-control-signal lines and the bit-line-connecting-transistor-control-signal lines, and are staggered.

6. The semiconductor storage device of claim 5, wherein in the sets of the main bit lines and the sub memory arrays, the bit-line connecting transistors in a first sub memory array out of the sub memory arrays are adjacent to, and are in line symmetry with, the bit-line connecting transistors in a second sub memory array adjacent to the first sub memory array out of the sub memory arrays in the boundary between the first sub memory array and the second sub memory array.

7. The semiconductor storage device of claim 6, wherein the bit-line connecting transistors in the first sub memory array are located at one of a first distance and a second distance larger than the first distance from respective adjacent ones of the bit-line connecting transistors in the second sub memory array, and each adjacent ones of the bit-line connecting transistors which are located at the first distance from each other share one of a source and a drain.

8. The semiconductor storage device of claim 7, wherein each of the cell-transistor-control-signal lines connected to the gate electrodes of the cell transistors is connected to a cell-transistor backing line at a plurality of portions, and each of the bit-line-connecting-transistor-control-signal lines connected to the gate electrodes of the bit-line connecting transistors is connected to a bit-line-connecting-transistor backing line at a plurality of portions.

9. The semiconductor storage device of claim 8, wherein the cell-transistor backing line and the bit-line-connecting-transistor backing line are included in an identical interconnection layer, the bit-line-connecting-transistor backing line is shared by first and second bit-line-connecting-transistor-control-signal lines out of the bit-line-connecting-transistor-control-signal lines, and the first and second bit-line-connecting-transistor-control-signal lines are respectively connected to the gate electrodes of the bit-line connecting transistors located at one of the first and second distances from each other, and the bit-line-connecting-transistor backing line is wider than the cell-transistor backing line.

10. The semiconductor storage device of claim 8, wherein the cell-transistor-control-signal lines, the cell-transistor backing lines, and the bit-line-connecting-transistor backing line are perpendicular to the main bit lines and the sub bit lines, the sub bit lines are included in a first metal interconnection layer, the main bit lines are included in a second metal interconnection layer located above the first metal interconnection layer, and the cell-transistor backing lines and the bit-line-connecting-transistor backing line are included in a third metal interconnection layer located above the second metal interconnection layer.

11. The semiconductor storage device of claim 8, further comprising:

cell-transistor driving circuits for driving the cell-transistor-control-signal lines, each of the cell-transistor driving circuits having an output circuit formed of a CMOS circuit; and bit-line-connecting-transistor driving circuits for driving the bit-line connecting transistors, each of the bit-line-connecting-transistor driving circuits having an output circuit formed of a CMOS circuit, wherein each of the bit-line-connecting-transistor driving circuits has a driving ability equal to or higher than twice and equal to or lower than four times that of each of the cell-transistor driving circuits.

12. The semiconductor storage device of claim 1, wherein the bit-line connecting transistors in one of the sub memory arrays are adjacent to the bit-line connecting transistors in another one of the sub memory arrays, dummy memory cells including dummy cell transistors and having no storage function are provided between the bit-line connecting transistors and the cell transistors, and a pattern formed of given numbers of the cell transistors, the bit-line connecting transistors and the dummy cell transistors is repeated.

13. The semiconductor storage device of claim 12, further comprising dummy-cell-transistor-control-signal lines intersecting the main bit lines and connected to gate electrodes of the dummy cell transistors, wherein the dummy memory cells have plate electrodes equivalent to plate electrodes in capacitors of the memory cells, and two of the dummy-cell-transistor-control-signal lines are located between the bit-line connecting transistors and the cell transistors.

14. The semiconductor storage device of claim 12, wherein the dummy cell transistors are always OFF.

15. The semiconductor storage device of claim 1, wherein the memory cells include capacitors connected to the sub bit lines via the cell transistors, and
    plate electrodes in the capacitors are connected to each other in each of the sub memory arrays and are separated from each other between the sub memory arrays.

16. The semiconductor storage device of claim 15, further comprising a dummy bit line that is not used for input and output of stored data,
    wherein the plate electrodes in the sub memory arrays are connected to each other via the dummy bit line.

17. The semiconductor storage device of claim 16, wherein the plate electrodes in the sub memory arrays are connected to the dummy bit line via respective contacts, and
    the contacts are arranged at the same pitch as contacts for connecting the cell transistors to the sub bit lines.

18. The semiconductor storage device of claim 16, wherein the dummy bit line is closer to the outside of each of the sub memory arrays than the sub bit lines,
    ends of the plate electrodes extending along the sub bit lines are linear, and
    openings through which contacts for connecting the cell transistors to the sub bit lines pass are formed in the plate electrodes to form repetitive patterns.

19. The semiconductor storage device of claim 1, wherein the bit-line connecting transistors are arranged in a first end of each of the sub memory arrays,
    a first sub memory array out of the sub memory arrays is adjacent to a second sub memory array out of the sub memory arrays such that a second end of the first sub memory array opposite the first end faces the second sub memory array, and
    dummy memory cells having no storage function are provided in the second end of each of the sub memory arrays.

20. The semiconductor storage device of claim 19, further comprising cell-transistor-control-signal lines intersecting the main bit lines and connected to gate electrodes of the cell transistors,
    wherein the dummy memory cells include dummy cell transistors and dummy capacitors and are arranged in a range which is a multiple of four times the pitch of the cell-transistor-control-signal lines, and
    a pattern formed of given numbers of the cell transistors, the bit-line connecting transistors and the dummy cell transistors is repeated.

21. The semiconductor storage device of claim 20, wherein one of the cell transistors and one of the dummy cell transistors adjacent to the cell transistor share one of source and drain electrodes, and
    one of the dummy cell transistors of the dummy memory cells in the first sub memory array and one of the dummy cell transistors of the dummy memory cells in the second sub memory array share one of source and drain electrodes.

22. The semiconductor storage device of claim 21, wherein at least one of the dummy memory cells is configured to be usable as an auxiliary memory cell.

23. The semiconductor storage device of claim 1, further comprising a plurality of sets of the main bit lines and the sub memory arrays,
    wherein adjacent ones of the main bit lines intersect to form a twisted structure.

24. The semiconductor storage device of claim 23, wherein the bit-line connecting transistors are arranged in a first end of each of the sub memory arrays,
    a first sub memory array out of the sub memory arrays is adjacent to a second sub memory array out of the sub memory arrays such that a second end of the first sub memory array opposite the first end faces the second sub memory array,
    dummy memory cells having no storage function are provided in the second end of each of the sub memory arrays, and
    the twisted structure is formed near a region where the dummy memory cells are provided.

25. The semiconductor storage device of claim 1, wherein the main bit lines have a length smaller than the sum of the lengths of the sub bit lines aligned along the main bit lines.

26. The semiconductor storage device of claim 25, wherein a line pattern included in an interconnection layer including the main bit lines is formed in a region extending from the main bit lines.

27. The semiconductor storage device of claim 26, wherein the line pattern is fixed at a precharge potential of the main bit lines.

28. A semiconductor storage device, comprising:
    a plurality of sub memory arrays each including a plurality of memory cells and sub bit lines, the memory cells including cell transistors;
    a main bit line; and
    bit-line connecting transistors for selectively connecting the sub bit lines to the main bit line,
    wherein the semiconductor storage device has a folded-bit-line architecture,
    the sub memory arrays are arranged such that the sub bit lines are aligned along the main bit line,
    a pattern formed of given numbers of the cell transistors and the bit-line connecting transistors is repeated,
    the bit-line connecting transistors in one of the sub memory arrays are adjacent to the bit-line connecting transistors in another one of the sub memory arrays,
    dummy memory cells including dummy cell transistors and having no storage function are provided between the bit-line connecting transistors and the cell transistors, and
    a pattern formed of given numbers of the cell transistors, the bit-line connecting transistors and the dummy cell transistors is repeated.

29. A semiconductor storage device, comprising:
    a plurality of sub memory arrays each including a plurality of memory cells and sub bit lines, the memory cells including cell transistors;
    a main bit line; and
    bit-line connecting transistors for selectively connecting the sub bit lines to the main bit line,
    wherein the semiconductor storage device has a folded-bit-line architecture,
    the sub memory arrays are arranged such that the sub bit lines are aligned along the main bit line,
    a pattern formed of given numbers of the cell transistors and the bit-line connecting transistors is repeated,
    the bit-line connecting transistors are arranged in a first end of each of the sub memory arrays,
    a first sub memory array out of the sub memory arrays is adjacent to a second sub memory array out of the sub memory arrays such that a second end of the first sub memory array opposite the first end faces the second sub memory array,
    dummy memory cells having no storage function are provided in the second end of each of the sub memory arrays, and at least one of the dummy memory cells is configured to be usable as an auxiliary memory cell.

30. A semiconductor storage device, comprising:
a plurality of sub memory arrays each including a plurality of memory cells and sub bit lines, the memory cells including cell transistors;
a main bit line; and
bit-line connecting transistors for selectively connecting the sub bit lines to the main bit line,
wherein the semiconductor storage device has a folded-bit-line architecture,
the sub memory arrays are arranged such that the sub bit lines are aligned along the main bit line,
a pattern formed of given numbers of the cell transistors and the bit-line connecting transistors is repeated, and
the main bit line has a length smaller than the sum of the lengths of the sub bit lines aligned along the main bit line.

31. The semiconductor storage device of claim 28, further comprising dummy-cell-transistor-control-signal lines intersecting the main bit line and connected to gate electrodes of the dummy cell transistors,
wherein the dummy memory cells have plate electrodes equivalent to plate electrodes in capacitors of the memory cells, and
two of the dummy-cell-transistor-control-signal lines are located between the bit-line connecting transistors and the cell transistors.

32. The semiconductor storage device of claim 28, wherein the dummy cell transistors are always OFF.

33. The semiconductor storage device of claim 29, further comprising cell-transistor-control-signal lines intersecting the main bit line and connected to gate electrodes of the cell transistors,
wherein the dummy memory cells include dummy cell transistors and dummy capacitors and are arranged in a range which is a multiple of four times the pitch of the cell-transistor-control-signal lines, and
a pattern formed of given numbers of the cell transistors, the bit-line connecting transistors and the dummy cell transistors is repeated.

34. The semiconductor storage device of claim 33, wherein one of the cell transistors and one of the dummy cell transistors adjacent to the cell transistor share one of source and drain electrodes, and
one of the dummy cell transistors of the dummy memory cells in the first sub memory array and one of the dummy cell transistors of the dummy memory cells in the second sub memory array share one of source and drain electrodes.

35. The semiconductor storage device of claim 30, wherein a line pattern included in an interconnection layer including the main bit line is formed in a region extending from the main bit line.

36. The semiconductor storage device of claim 35, wherein the line pattern is fixed at a precharge potential of the main bit line.

37. A semiconductor storage device, comprising:
a plurality of sub memory arrays each including a plurality of memory cells and sub bit lines, the memory cells including cell transistors;
a main bit line overlapping the sub bit lines in plan view along the length of the sub bit lines; and
bit-line connecting transistors for selectively connecting the sub bit lines to the main bit line,
wherein the semiconductor storage device has a folded-bit-line architecture,
the sub memory arrays are arranged such that the sub bit lines are aligned along the main bit line,
a pattern formed of given numbers of the cell transistors and the bit-line connecting transistors is repeated,
the memory cells further include capacitors connected to the sub bit lines via the cell transistors, and
the cell transistors and the bit-line connecting transistors are MOS transistors,
said semiconductor storage device further comprising:
a plurality of sets of the main bit line and the sub memory arrays;
cell-transistor-control-signal lines intersecting the main bit lines and each connected to gate electrodes of corresponding ones of the cell transistors in the respective sub memory arrays in the sets of the main bit line and the sub memory arrays;
bit-line-connecting-transistor-control-signal lines intersecting the main bit lines and each connected to gate electrodes of corresponding ones of the bit-line connecting transistors in the respective sub memory arrays in the sets of the main bit line and the sub memory arrays; and
each of the cell transistors and the bit-line connecting transistors is provided at an intersection of one of the main bit lines and an associated one of the cell-transistor-control-signal lines and the bit-line-connecting-transistor-control-signal lines, and are staggered,
wherein in the sets of the main bit line and the sub memory arrays, the bit-line connecting transistors in a first sub memory array out of the sub memory arrays are adjacent to, and are in line symmetry with, the bit-line connecting transistors in a second sub memory array adjacent to the first sub memory array out of the sub memory arrays in the boundary between the first sub memory array and the second sub memory array,
the bit-line connecting transistors in the first sub memory array are located at one of a first distance and a second distance larger than the first distance from respective adjacent ones of the bit-line connecting transistors in the second sub memory array,
each adjacent ones of the bit-line connecting transistors which are located at the first distance from each other share one of a source and a drain,
each of the cell-transistor-control-signal lines connected to the gate electrodes of the cell transistors is connected to a cell-transistor backing line at a plurality of portions,
each of the bit-line-connecting-transistor-control-signal lines connected to the gate electrodes of the bit-line connecting transistors is connected to a bit-line-connecting-transistor backing line at a plurality of portions,
the cell-transistor backing line and the bit-line-connecting-transistor backing line are included in an identical interconnection layer,
the bit-line-connecting-transistor backing line is shared by first and second bit-line-connecting-transistor-control-signal lines out of the bit-line-connecting-transistor-control-signal lines, and the first and second bit-line-connecting-transistor-control-signal lines are respectively connected to the gate electrodes of the bit-line connecting transistors located at one of the first and second distances from each other, and
the bit-line-connecting-transistor backing line is wider than the cell-transistor backing line.

38. A semiconductor storage device, comprising:
a plurality of sub memory arrays each including a plurality of memory cells and sub bit lines, the memory cells including cell transistors;

a main bit line overlapping the sub bit lines in plan view along the length of the sub bit lines; and bit-line connecting transistors for selectively connecting the sub bit lines to the main bit line, wherein the semiconductor storage device has a folded-bit-line architecture, the sub memory arrays are arranged such that the sub bit lines are aligned along the main bit line, a pattern formed of given numbers of the cell transistors and the bit-line connecting transistors is repeated, the memory cells further include capacitors connected to the sub bit lines via the cell transistors, and the cell transistors and the bit-line connecting transistors are MOS transistors, said semiconductor storage device further comprising:

a plurality of sets of the main bit line and the sub memory arrays;

cell-transistor-control-signal lines intersecting the main bit lines and each connected to gate electrodes of corresponding ones of the cell transistors in the respective sub memory arrays in the sets of the main bit line and the sub memory arrays;

bit-line-connecting-transistor-control-signal lines intersecting the main bit lines and each connected to gate electrodes of corresponding ones of the bit-line connecting transistors in the respective sub memory arrays in the sets of the main bit line and the sub memory arrays; and each of the cell transistors and the bit-line connecting transistors is provided at an intersection of one of the main bit lines and an associated one of the cell-transistor-control-signal lines and the bit-line-connecting-transistor-control-signal lines, and are staggered, wherein in the sets of the main bit line and the sub memory arrays, the bit-line connecting transistors in a first sub memory array out of the sub memory arrays are adjacent to, and are in line symmetry with, the bit-line connecting transistors in a second sub memory array adjacent to the first sub memory array out of the sub memory arrays in the boundary between the first sub memory array and the second sub memory array, the bit-line connecting transistors in the first sub memory array are located at one of a first distance and a second distance larger than the first distance from respective adjacent ones of the bit-line connecting transistors in the second sub memory array, each adjacent ones of the bit-line connecting transistors which are located at the first distance from each other share one of a source and a drain, each of the cell-transistor-control-signal lines connected to the gate electrodes of the cell transistors is connected to a cell-transistor backing line at a plurality of portions, and each of the bit-line-connecting-transistor-control-signal lines connected to the gate electrodes of the bit-line connecting transistors is connected to a bit-line-connecting-transistor backing line at a plurality of portions, said semiconductor storage device further comprising:

cell-transistor driving circuits for driving the cell-transistor-control-signal lines, each of the cell-transistor driving circuits having an output circuit formed of a CMOS circuit; and bit-line-connecting-transistor driving circuits for driving the bit-line connecting transistors, each of the bit-line-connecting-transistor driving circuits having an output circuit formed of a CMOS circuit, wherein each of the bit-line-connecting-transistor driving circuits has a driving ability equal to or higher than twice and equal to or lower than four times that of each of the cell-transistor driving circuits.

39. A semiconductor storage device, comprising:

a plurality of sub memory arrays each including a plurality of memory cells and sub bit lines, the memory cells including cell transistors;

a main bit line overlapping the sub bit lines in plan view along the length of the sub bit lines; and bit-line connecting transistors for selectively connecting the sub bit lines to the main bit line, wherein the semiconductor storage device has a folded-bit-line architecture, the sub memory arrays are arranged such that the sub bit lines are aligned along the main bit line, and a pattern formed of given numbers of the cell transistors and the bit-line connecting transistors is repeated, wherein the bit-line connecting transistors are arranged in a first end of each of the sub memory arrays, a first sub memory array out of the sub memory arrays is adjacent to a second sub memory array out of the sub memory arrays such that a second end of the first sub memory array opposite the first end faces the second sub memory array, and dummy memory cells having no storage function are provided in the second end of each of the sub memory arrays, said semiconductor storage device further comprising cell-transistor-control-signal lines intersecting the main bit line and connected to gate electrodes of the cell transistors, wherein the dummy memory cells include dummy cell transistors and dummy capacitors and are arranged in a range which is a multiple of four times the pitch of the cell-transistor-control-signal lines, a pattern formed of given numbers of the cell transistors, the bit-line connecting transistors and the dummy cell transistors is repeated, one of the cell transistors and one of the dummy cell transistors adjacent to the cell transistor share one of source and drain electrodes, one of the dummy cell transistors of the dummy memory cells in the first sub memory array and one of the dummy cell transistors of the dummy memory cells in the second sub memory array share one of source and drain electrodes, and at least one of the dummy memory cells is configured to be usable as an auxiliary memory cell.

* * * * *